(12) United States Patent
Wang et al.

(10) Patent No.: US 12,183,714 B2
(45) Date of Patent: Dec. 31, 2024

(54) PACKAGE STRUCTURES AND METHOD FOR FORMING THE SAME

(71) Applicant: Taiwan Semiconductor Manufacturing Company, Ltd., Hsinchu (TW)

(72) Inventors: Chin-Hua Wang, New Taipei (TW); Shu-Shen Yeh, Taoyuan (TW); Yu-Sheng Lin, Zhubei (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 72 days.

(21) Appl. No.: 17/395,946

(22) Filed: Aug. 6, 2021

(65) Prior Publication Data
US 2022/0359465 A1 Nov. 10, 2022

Related U.S. Application Data

(60) Provisional application No. 63/185,624, filed on May 7, 2021.

(51) Int. Cl.
*H01L 25/065* (2023.01)
*H01L 21/48* (2006.01)
*H01L 23/00* (2006.01)

(52) U.S. Cl.
CPC ...... *H01L 25/0655* (2013.01); *H01L 21/4817* (2013.01); *H01L 24/16* (2013.01);
(Continued)

(58) Field of Classification Search
CPC ............ H01L 21/4817; H01L 23/3675; H01L 23/552–556; H01L 23/562–576; H01L 23/3157; H01L 23/498–49894; H01L 23/538–5389; H01L 23/49822; H01L 23/49833; H01L 23/5385; H01L 23/4985;
(Continued)

(56) References Cited

U.S. PATENT DOCUMENTS 11,430,768 B2* 8/2022 Wang ............... H01L 23/481
2010/0044100 A1* 2/2010 Ono ..................... H05K 9/0083
174/521

(Continued)

FOREIGN PATENT DOCUMENTS

TW 202009208 A 3/2020
TW 202115841 A * 4/2021 ......... H01L 21/4857

*Primary Examiner* — Victor A Mandala
*Assistant Examiner* — Lawrence C Tynes, Jr.
(74) *Attorney, Agent, or Firm* — Birch, Stewart, Kolasch & Birch, LLP

(57) ABSTRACT

A package structure is provided. The package structure includes a first package component, a second package component, and a lid structure. The first package component includes a plurality of integrated circuit dies and an underfill formed between the integrated circuit dies. The second package component includes a substrate, and the first package component is mounted on the substrate. The lid structure is disposed on the second package component and around the first package component, and the lid structure covers the integrated circuit dies and exposes the underfill.

20 Claims, 21 Drawing Sheets

(52) U.S. Cl.
CPC .............. *H01L 24/32* (2013.01); *H01L 24/73* (2013.01); *H01L 2224/16227* (2013.01); *H01L 2224/32225* (2013.01); *H01L 2224/73204* (2013.01); *H01L 2924/1611* (2013.01)

(58) Field of Classification Search
CPC ....... H01L 23/5387; H01L 2924/16151; H01L 2924/16153; H01L 2924/16251; H01L 25/042; H01L 25/072; H01L 25/0753; H01L 25/115; H01L 25/0655; H01L 25/10–13; H01L 25/03–0756; H01L 25/0652; H01L 25/071; H01L 25/112; H01L 25/046–048; H01L 25/065–0657; H01L 25/105; H01L 25/16–167; H01L 2225/10–1094; H01L 2225/03–06596; H01L 2225/065–06596; H01L 2225/1005–1094; H05K 5/0047; H01H 2071/0292

See application file for complete search history.

(56) References Cited

U.S. PATENT DOCUMENTS

| | | | | |
|---|---|---|---|---|
| 2017/0162542 | A1* | 6/2017 | Chen | H01L 21/56 |
| 2017/0263544 | A1* | 9/2017 | Hiner | H01L 25/50 |
| 2018/0350755 | A1* | 12/2018 | Huang | H01L 25/18 |
| 2020/0411407 | A1* | 12/2020 | Dubey | H01L 25/0652 |
| 2021/0202455 | A1* | 7/2021 | Tsai | H01L 25/0655 |
| 2022/0189923 | A1* | 6/2022 | Wang | H01L 25/0657 |

* cited by examiner

PACKAGE STRUCTURES AND METHOD FOR FORMING THE SAME

CROSS REFERENCE TO RELATED APPLICATIONS

This application claims the benefit of U.S. Provisional Application No. 63/185,624, filed May 7, 2021, the entirety of which is incorporated by reference herein.

BACKGROUND

The semiconductor industry has experienced rapid growth due to ongoing improvements in the integration density of a variety of electronic components (e.g., transistors, diodes, resistors, capacitors, etc.). For the most part, improvements in integration density have resulted from iterative reductions of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

Although existing package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
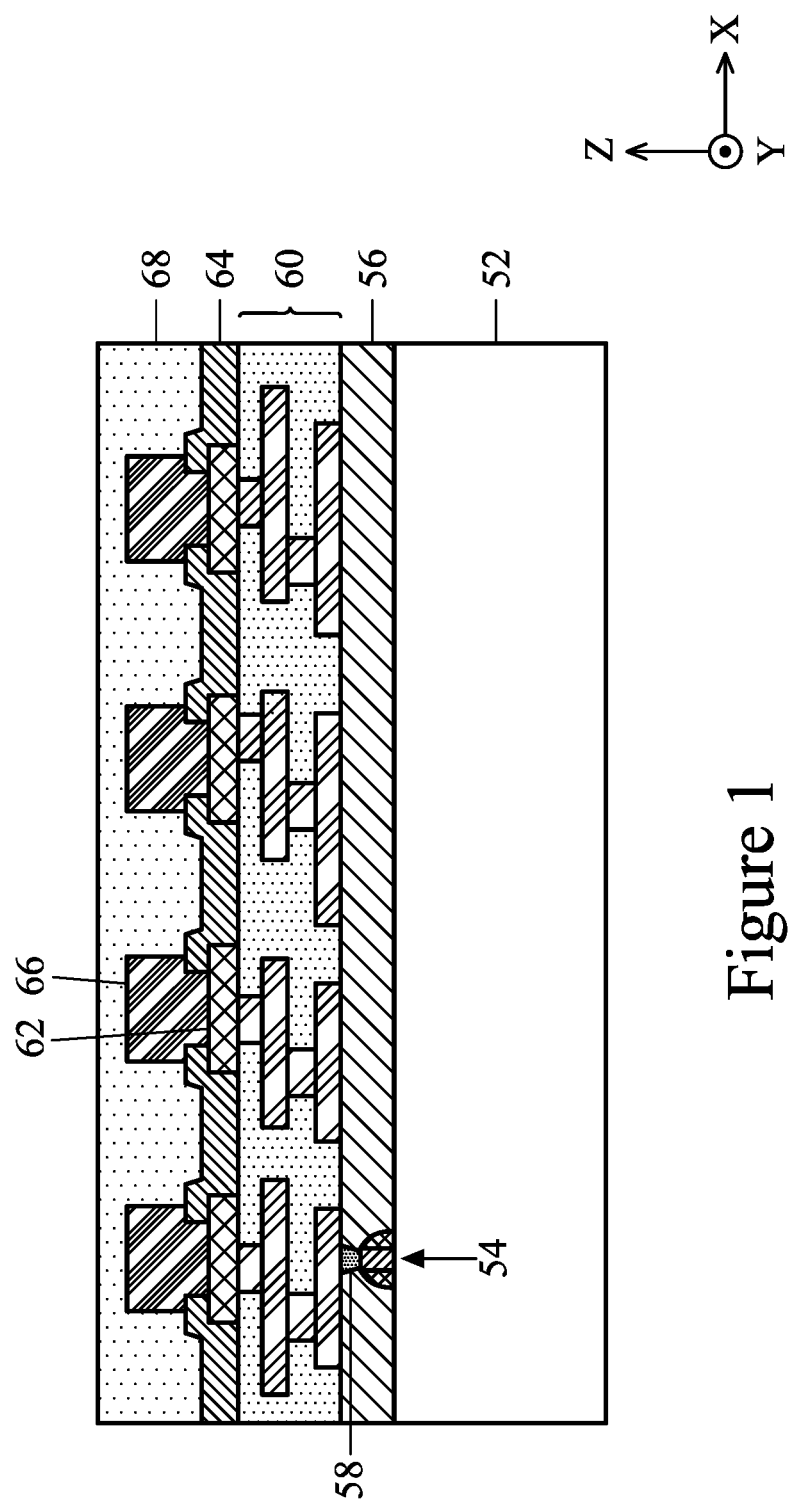
FIG. 1 illustrates a cross-sectional view of an integrated circuit die in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments of package structures are provided. The package structure includes a lid structure disposed on the substrate. The lid structure covers the integrated circuit dies and exposes the underfill between the integrated circuit dies. Accordingly, the issue that the coefficients of thermal expansion (CTE) are mismatched among different elements is solved. For example, the lid structure includes a plurality of separate sections to achieve the above function. In addition, the lid structure is also configured to protect the electronic component and/or reduce the warpage of the package structure.

FIG. 1 illustrates a cross-sectional view of an integrated circuit die 50 in accordance with some embodiments. The integrated circuit die 50 will be packaged in subsequent processing to form an integrated circuit package. In some embodiments, the integrated circuit die 50 includes a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

In some embodiments, the integrated circuit die 50 is formed in a wafer, which may include different device regions that are singulated in subsequent steps to form a plurality of integrated circuit dies. In some embodiments, the integrated circuit die 50 is processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. In some embodiments, the semiconductor substrate 52 includes other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side and an inactive surface (e.g., the surface facing downwards in FIG. 1), sometimes called a back side.

In some embodiments, devices (represented by a transistor) 54 are formed at the front side of the semiconductor substrate 52. In some embodiments, the devices 54 are active devices (e.g., transistors, diodes, etc.), capacitors, resistors, etc. An inter-layer dielectric (ILD) 56 is over the front side of the semiconductor substrate 52. In some embodiments, the ILD 56 surrounds and may cover the devices 54. In some embodiments, the ILD 56 includes one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

In some embodiments, conductive plugs 58 extend through the ILD 56 to electrically and physically couple the devices 54. For example, when the devices 54 are transistors, the conductive plugs 58 may couple the gates or source/drain regions of the transistors. In some embodiments, the conductive plugs 58 is formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. In some embodiments, the interconnect structure 60 is formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. In some embodiments, the die connectors 66 are formed by, for example, plating, or the like. The die connectors 66 electrically couple the respective integrated circuits of the integrated circuit die 50.

Optionally, solder regions (e.g., solder balls or solder bumps) may be disposed on the pads 62. In some embodiments, some solder balls are used to perform chip probe (CP) testing on the integrated circuit die 50. In some embodiments, the CP testing is performed on the integrated circuit die 50 to ascertain whether the integrated circuit die 50 is a known good die (KGD). In some embodiments, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. Initially, in some embodiments, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well.

In some embodiments, the dielectric layer 68 includes a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. In some embodiments, the dielectric layer 68 is formed, for example, by spin coating, lamination, chemical vapor deposition (CVD), or the like.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 11 illustrate cross-sectional views of intermediate steps during a process for forming a first package component 100, in accordance with some embodiments. In some embodiments, multiple integrated circuit dies 50 are packaged to form an integrated circuit package. In some embodiments, the integrated circuit packages may also be referred to as integrated fan-out (InFO) packages. However, the present disclosure is not limited thereto. It should be noted that a plurality of first package components 100 may be formed in a wafer and singulated in the processes. For the sake of clarity and simplicity, one first package component 100 is shown in the present disclosure.

Figure 2:
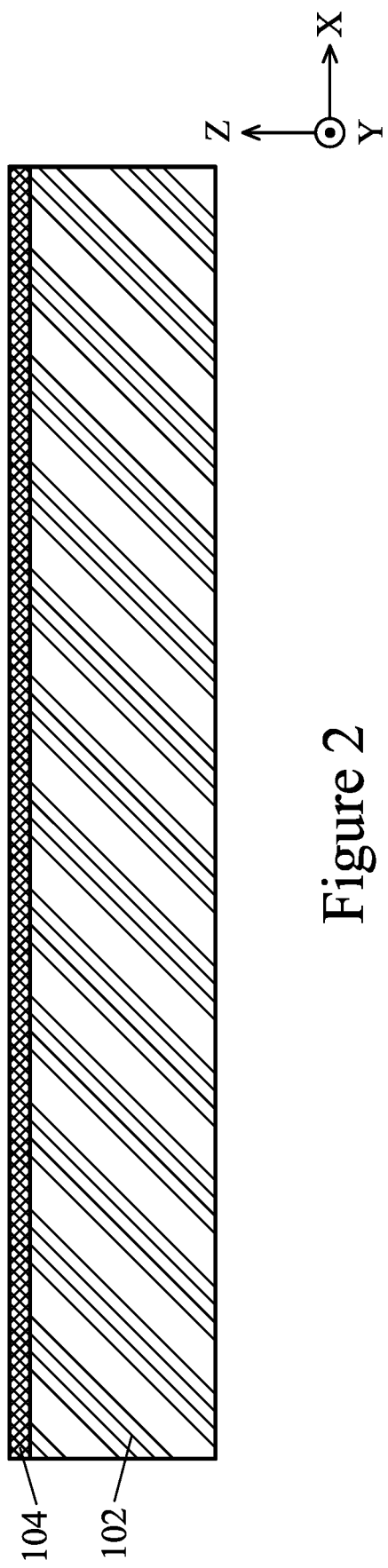
FIGS. 2 through 11 illustrate cross-sectional views of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. In some embodiments, the carrier substrate 102 includes a wafer, such that multiple packages can be formed on the carrier substrate 102 simultaneously.

In some embodiments, the release layer 104 is formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. In some embodiments, the release layer 104 may be dispensed as a liquid and cured, may be a laminate film laminated onto the carrier substrate 102, or may be the like. In some embodiments, the top surface of the release layer 104 is leveled and has a high degree of planarity.

Figure 3:
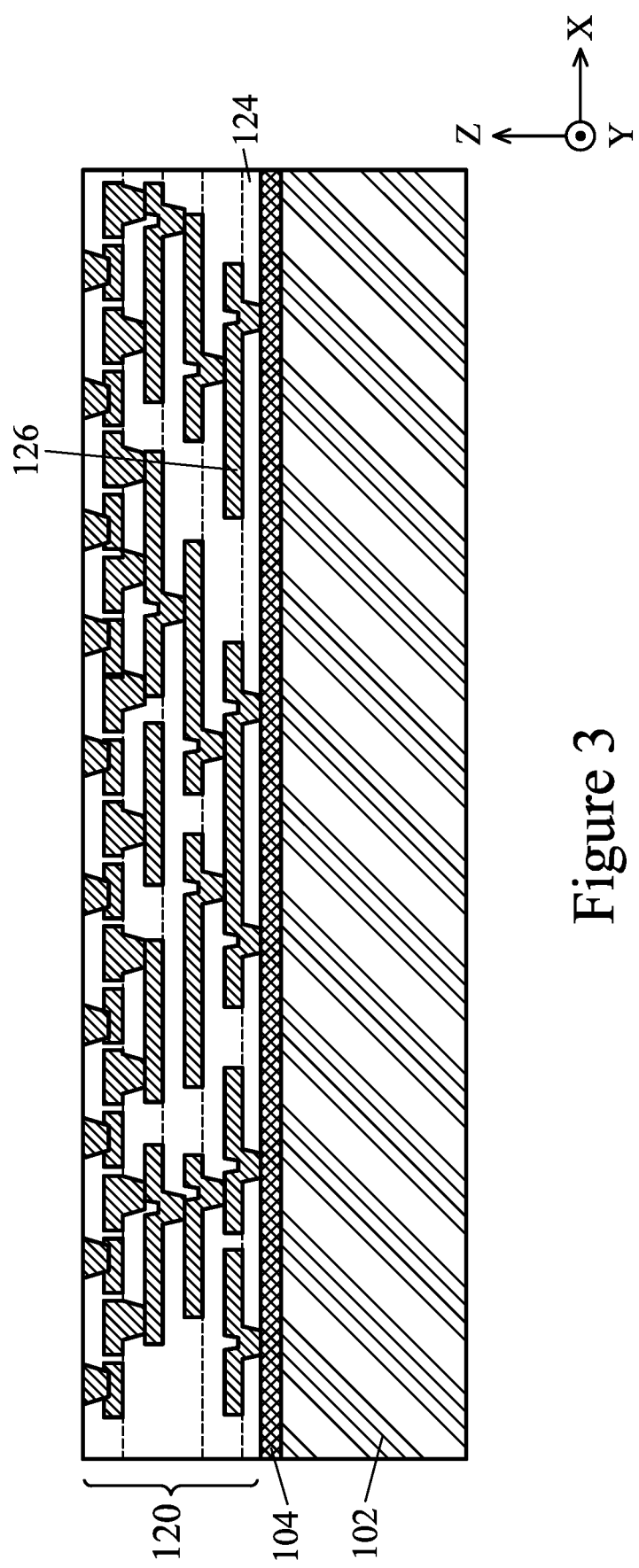

In FIG. 3, a redistribution structure 120 is formed over the release layer 104. In some embodiments, the metallization patterns may also be referred to as redistribution layers or redistribution lines. The redistribution structure 120 is shown as an example having multiple layers of metallization patterns 126 and dielectric layers 124 that are alternatively stacked. In some embodiments, the dielectric layer 124 is formed of a photo-sensitive material such as PBO, polyimide, BCB, or the like, which may be patterned using a lithography mask. In some embodiments, the dielectric layers 124 are formed by spin coating, lamination, CVD, the like, or a combination thereof. In some embodiments, the dielectric layer 124 may be patterned by an acceptable process, such as by exposing and developing the dielectric layers 124 to light when the dielectric layers 124 are a photo-sensitive material or by etching using, for example, an anisotropic etch.

In some embodiments, the metallization patterns 126 include conductive elements extending along the major surface of the dielectric layers 124 and extending through the dielectric layers 124. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. In some embodiments, the seed layer is formed using, for example, physical vapor deposition (PVD) or the like. A photoresist is then formed and patterned on the seed layer. In some embodiments, the photoresist is formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. In some embodiments, the conductive material is formed by plating, such as electroplating or electroless plating, or the like. In some embodiments, the conductive material includes a metal, like copper, titanium, tungsten, aluminum, or the like. The combination of the conductive material and underlying portions of the seed layer form the metallization pattern 126. The photoresist and portions of the seed layer on which the conductive material is not formed are removed. In some embodiments, the photoresist is removed by an acceptable ashing or stripping process, such as using an oxygen plasma or the like. Once the photoresist is removed, exposed portions of the seed layer are removed, such as by using an acceptable etching process, such as by wet or dry etching.

Figure 4:
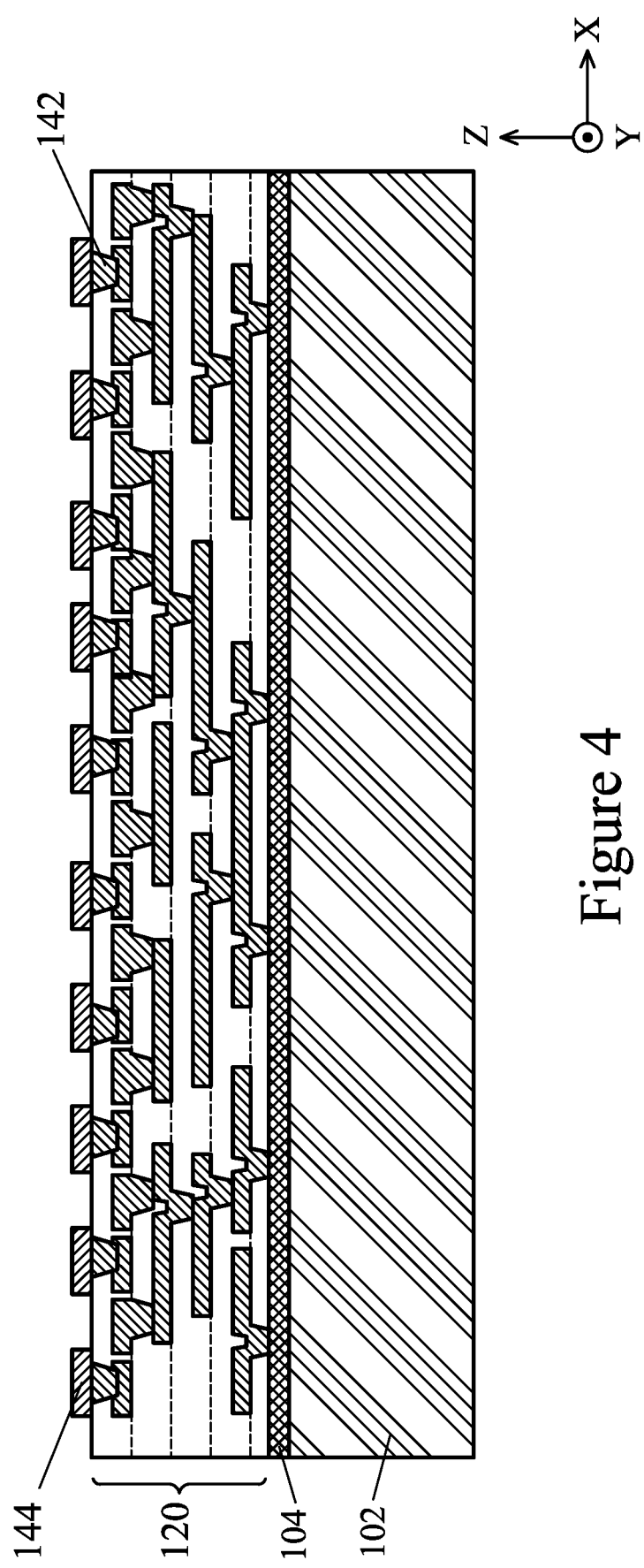

In FIG. 4, conductive vias 142 are then formed in the redistribution structure 120. As an example to form the conductive vias 142, a seed layer is formed in the openings extending through the dielectric layer 124. In some embodiments, the seed layer is a metal layer, which is a single layer or a composite layer comprising a plurality of sub-layers formed of different materials. In some embodiments, the seed layer comprises a titanium layer and a copper layer over the titanium layer. In some embodiments, the seed layer is formed using, for example, PVD or the like. A conductive material is then formed on the seed layer in the openings. In some embodiments, the conductive material is formed by plating, such as electroplating or electroless plating, or the like. In some embodiments, the conductive material includes a metal, like copper, titanium, tungsten, aluminum, or the like. The combination of the conductive material and underlying portions of the seed layer form the conductive vias 142.

In some embodiments, under-bump metallurgies (UBMs) 144 are formed for external connection to the conductive vias 142. The UBMs 144 may be referred to as pads 144. The UBMs 144 have bump portions on and extending along the major surface of the dielectric layer 124 and physically and electrically couple the conductive vias 142. In some embodiments, the UBMs 144 are formed of the same material as the conductive vias 142. In some embodiments, the UBMs 144 includes alloys such as electroless nickel, electroless palladium, immersion gold, electroless nickel, or the like.

Figure 5:
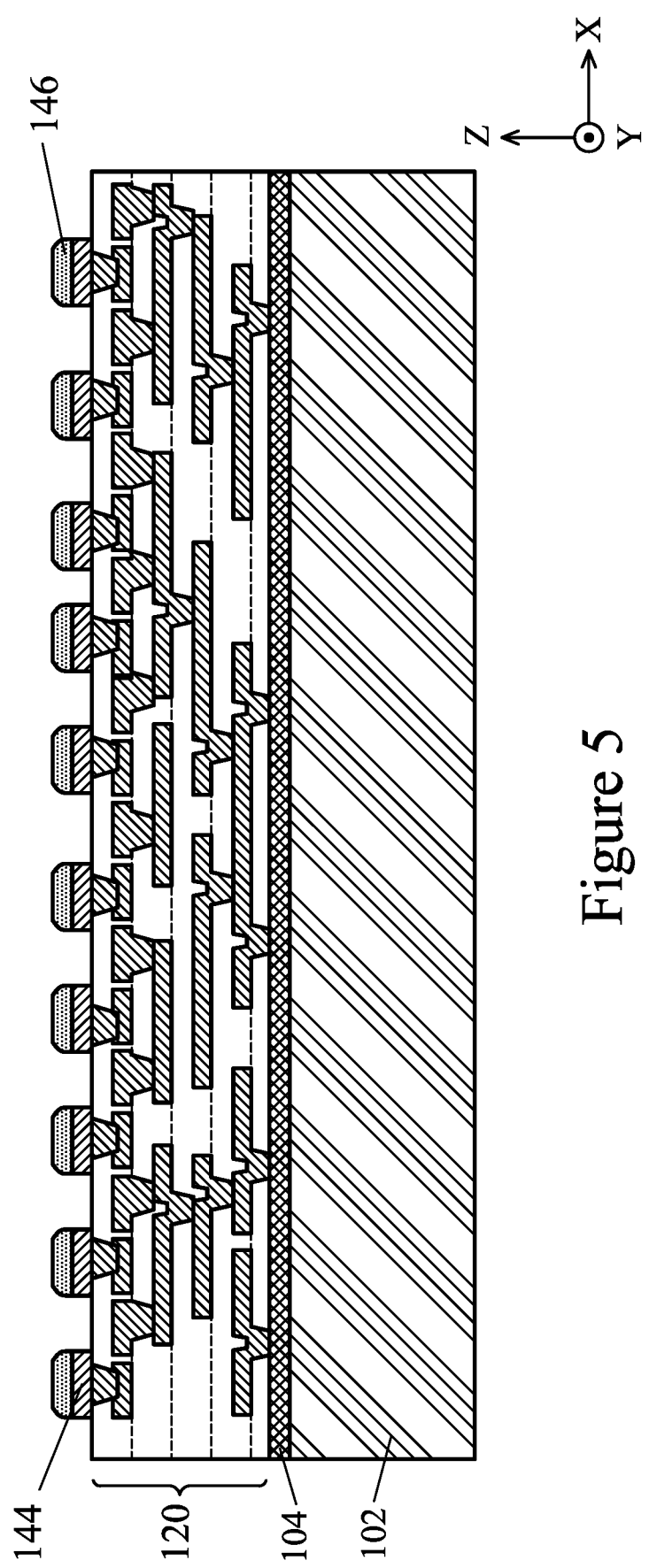

In FIG. 5, conductive connectors 146 are formed on the UBMs 144. In some embodiments, the conductive connectors 146 includes ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 146 includes a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as a copper pillar) formed by sputtering, printing, electro plating, electroless plating, CVD, or the like. In some embodiments, the metal pillars are solder free and have substantially vertical sidewalls. In some embodiments, a metal cap layer is formed on the top of the metal pillars. In some embodiments, the metal cap layer includes nickel, tin, tin-lead, gold, silver, palladium, indium, nickel-palladium-gold, nickel-gold, the like, or a combination thereof and may be formed by a plating process.

Figure 6:
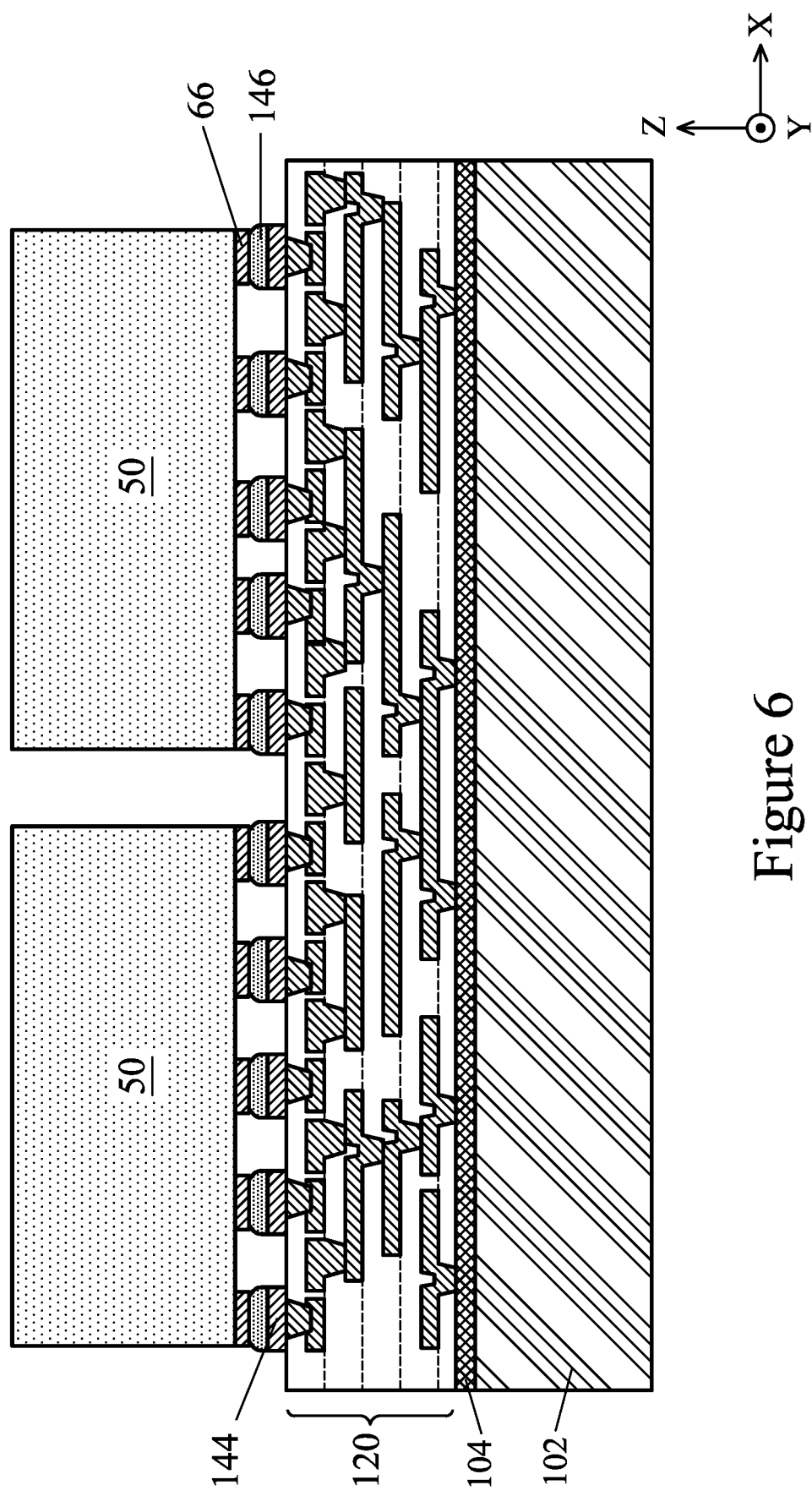

In FIG. 6, integrated circuit dies 50 are attached to the structure of FIG. 5. A desired type and quantity of integrated circuit dies 50 are adopted. In some embodiments, the integrated circuit dies 50 are referred to as package modules. In the embodiment shown, multiple integrated circuit dies 50 are adhered adjacent one another. For example, one of the integrated circuit dies 50 may be a logic device, such as a central processing unit (CPU), a graphics processing unit (GPU), a system-on-a-chip (SoC), a microcontroller, or the like. The other integrated circuit die 50 may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50 are the same type of dies, such as SoC dies. In some embodiments, the integrated circuit dies 50 are formed in the processes of the same technology node, or they are formed in the processes of different technology nodes. For example, one of the integrated circuit dies 50 may be of a more advanced process node than the other of the integrated circuit dies 50. The integrated circuit dies 50 may be different sizes (e.g., different heights and/or surface areas), or they may be the same size (e.g., the same height and/or surface area).

In some embodiments, the integrated circuit dies 50 are attached to the conductive connectors 146. That is, the die connectors 66 of the integrated circuit dies 50 are connected to the conductive connectors 146 opposite the UBMs 144.

In some embodiments, the conductive connectors 146 are reflowed to attach the integrated circuit dies 50 to the UBMs 144. The conductive connectors 146 electrically and/or physically couple the redistribution structure 120, including metallization patterns in the redistribution structure 120, to the integrated circuit dies 50.

In some embodiments, the conductive connectors 146 have an epoxy flux (not shown) formed thereon before they are reflowed with at least some of the epoxy portion of the epoxy flux remaining after the integrated circuit dies 50 are attached to the redistribution structure 120. This remaining epoxy portion may act as an underfill to reduce stress and protect the joints resulting from reflowing the conductive connectors 146.

Figure 7:
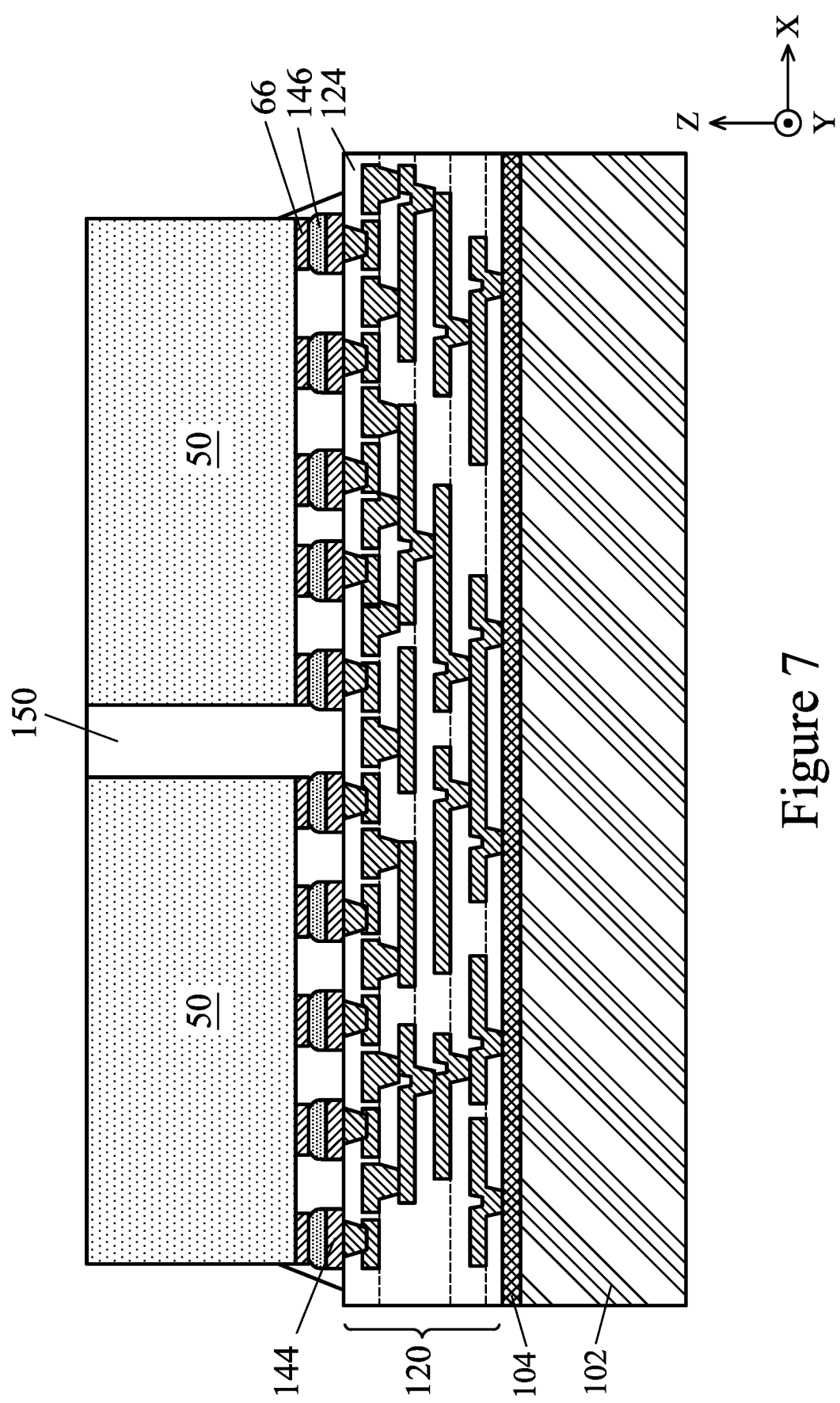

In FIG. 7, an underfill 150 is formed between the integrated circuit dies 50 and the dielectric layer 124, including between and around the UBMs 144, the conductive connectors 146, and the die connectors 66. In some embodiments, the underfill 150 is formed by a capillary flow process after the integrated circuit dies 50 are attached or is formed by a suitable deposition method before the integrated circuit dies 50 are attached. In some embodiments, the underfill 150 is also between the integrated circuit dies 50.

Figure 8:
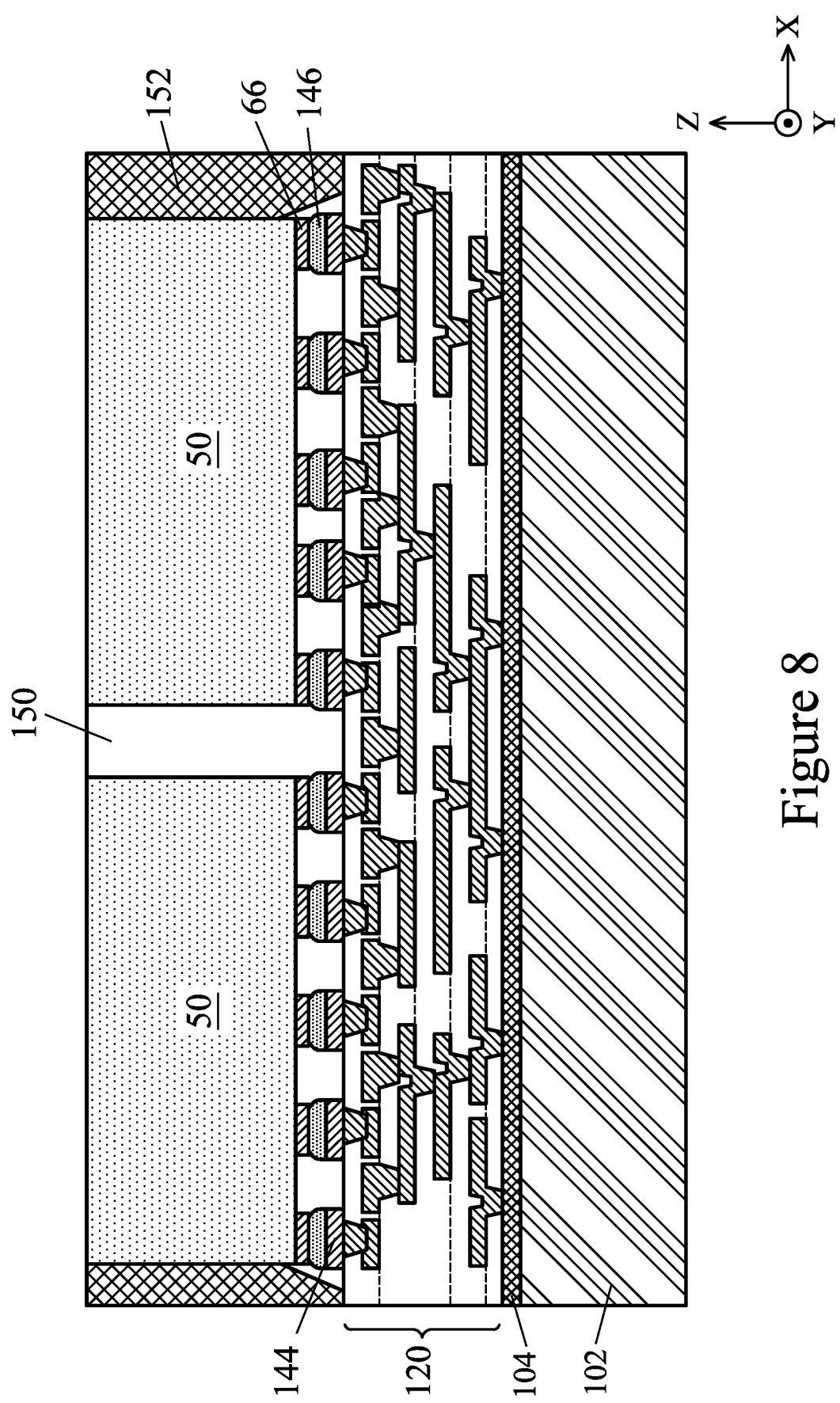

In FIG. 8, an encapsulant 152 is formed around the integrated circuit dies 50, the conductive connectors 146, and the underfill 150. After formation, the encapsulant 152 encapsulates the conductive connectors 146 and the integrated circuit dies 50. In some embodiments, the encapsulant 152 is a molding compound, epoxy, or the like. In some embodiments, the encapsulant 152 is applied by compression molding, transfer molding, or the like. In some embodiments, the encapsulant 152 is applied in liquid or semi-liquid form and then subsequently cured. In some embodiments, a planarization step may be performed to remove and planarize an upper surface of the encapsulant 152. In some embodiments, surfaces of the underfill 150, the encapsulant 152, and the integrated circuits dies 50 are coplanar (within process variation).

Figure 9:
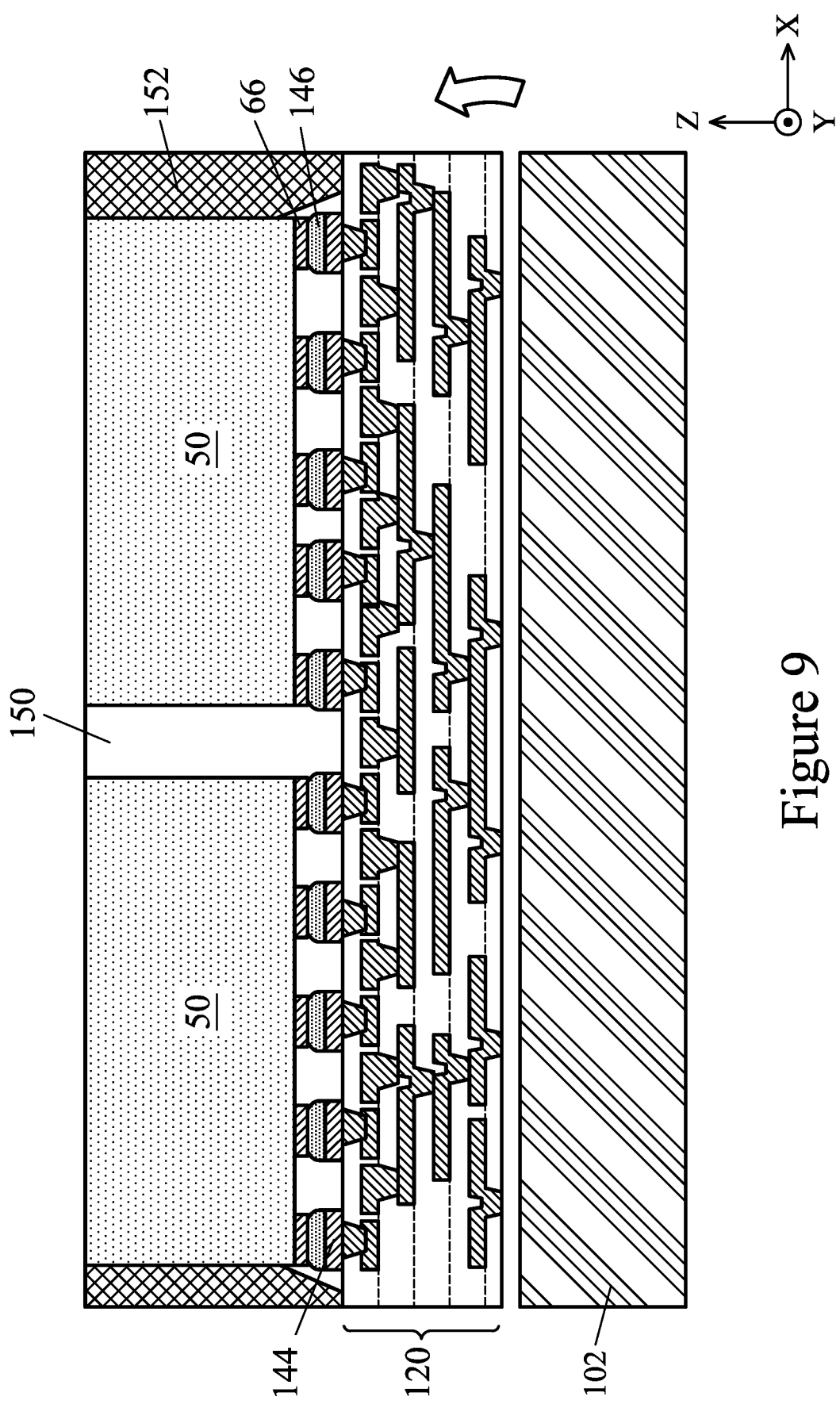

In FIG. 9, a carrier substrate de-bonding is performed to detach (or "de-bond") the carrier substrate 102 from the redistribution structure 120, e.g., the dielectric layer 124. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Figure 10:
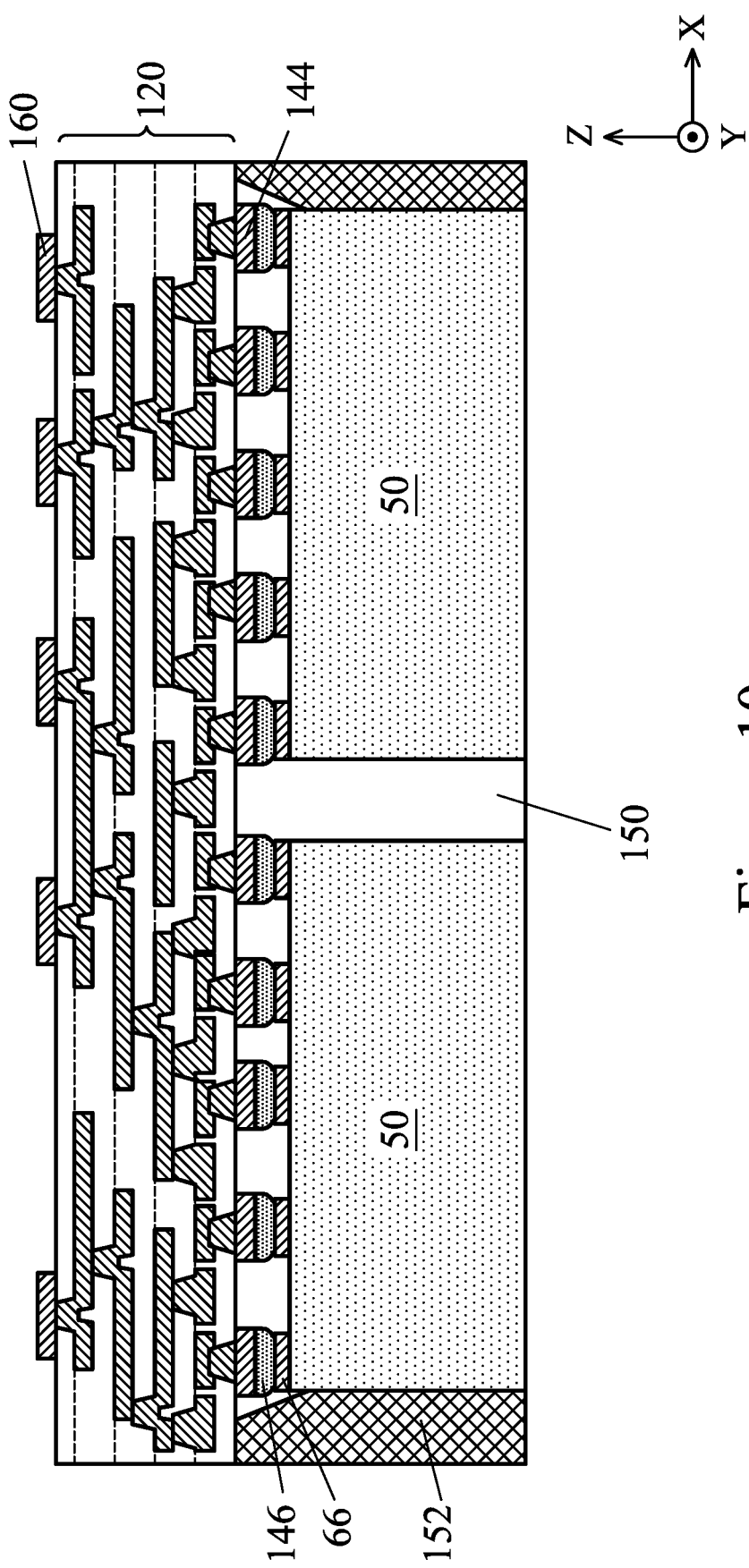

In FIG. 10, UBMs 160 are formed for external connection to the redistribution structure 120, e.g., the metallization pattern 126. The UBMs 160 have bump portions on and extending along the major surface of the dielectric layer 124. In some embodiments, the UBMs 160 are formed of the same material as the metallization pattern 126.

Figure 11:
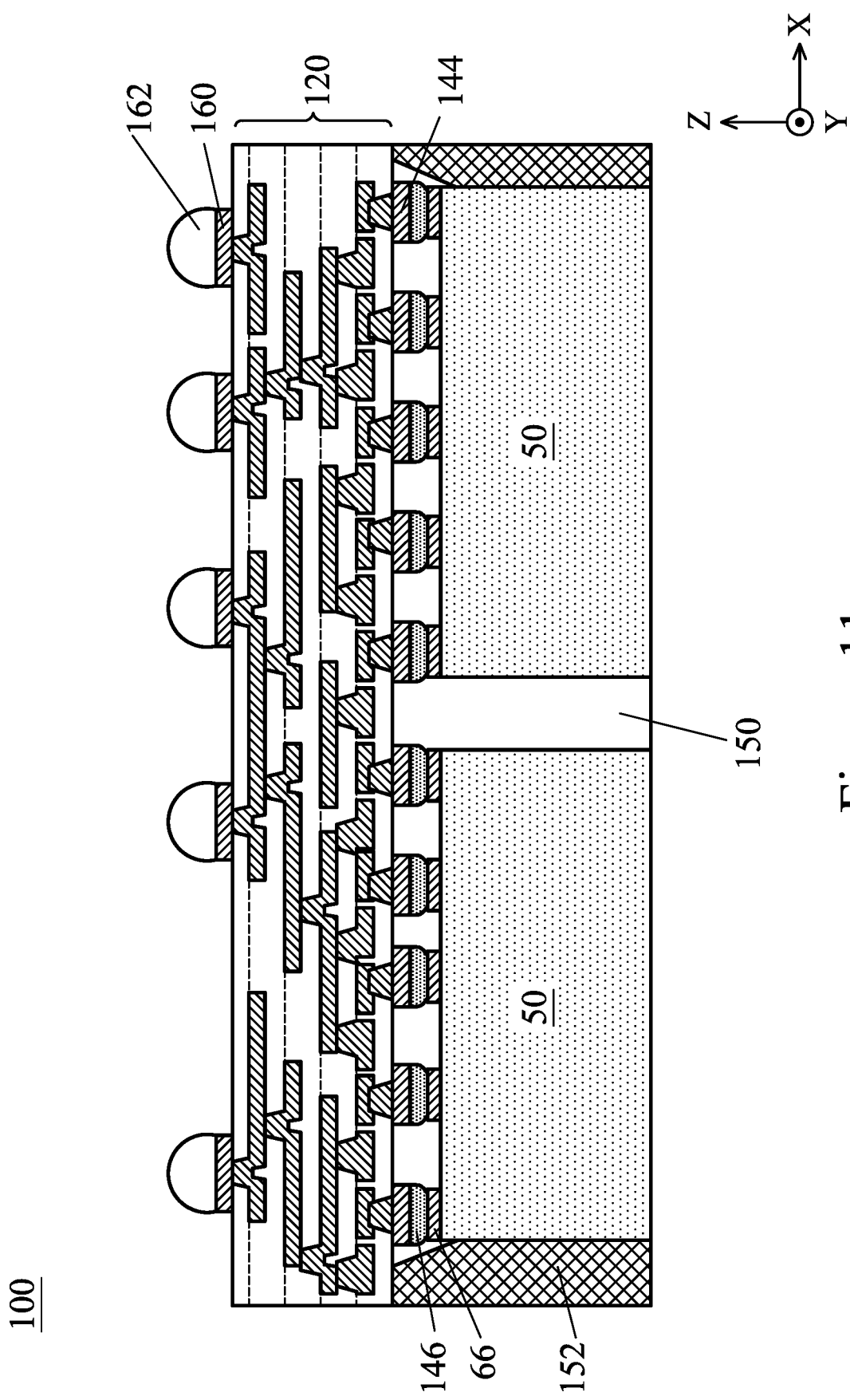

In FIG. 11, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 162 include a conductive material such as solder, copper, aluminum, gold, nickel, silver, palladium, tin, the like, or a combination thereof. In some embodiments, the conductive connectors 162 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 162 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 12:
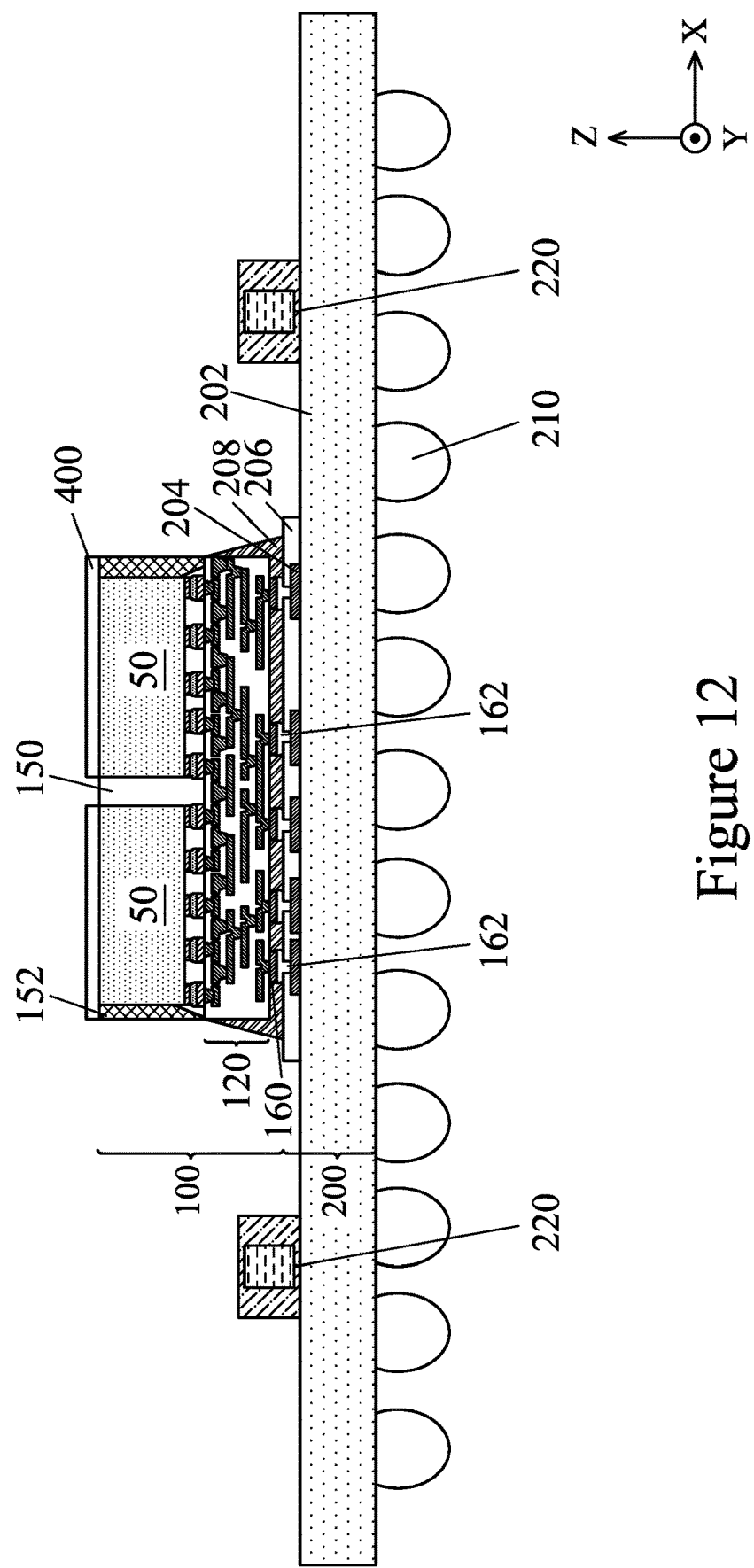
FIGS. 12 and 13 illustrate cross-sectional views of formation and implementation of package component stacks in accordance with some embodiments.

In FIG. 12, the first package component 100 may be mounted on the second package component 200 using the conductive connectors 162. The second package component 200 includes a substrate 202 and bond pads 204 over the substrate 202. In some embodiments, the substrate 202 is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, in some embodiments, the substrate 202 is a semiconductor-on-insulator (SOI) substrate. Generally, an SOI substrate includes a layer of a semiconductor material such as epitaxial silicon, germanium, silicon germanium, SOI, SGOI, or combinations thereof. The substrate 202 is, in one alternative embodiment, based on an insulating core such as a fiberglass reinforced resin core. One example core material is fiberglass resin. Alternatives for the core material include bismaleimide-triazine (BT) resin, or alternatively, other PCB materials or films. Build up films or other laminates may be used for substrate 202.

In some embodiments, the second package component 200 includes bump structures 210. In some embodiments, the bump structures 210 may be conductive ball structures (such as ball grid array (BGA)), conductive pillar structures, or conductive paste structures that are mounted on and electrically coupled to the substrate 202 in the bonding process.

In some embodiments, one or more electronic component 220 is formed on the second package component 200. The electronic component 220 is bonded to and exposed from the substrate 202. In some embodiments, the electronic component 220 is embedded in the substrate 202. In some embodiments, the electronic component 220 may be active and/or passive devices. For example, the electronic component 220 may be a wide variety of devices such as transistors, capacitors, resistors, combinations of these, and the like may be used to generate the structural and functional requirements of the design for the device stack. In some embodiments, the electronic components are formed using any suitable methods.

The substrate 202 may also include metallization layers and vias (not shown), with the bond pads 204 being physically and/or electrically coupled to the metallization layers and vias. In some embodiments, the metallization layers are formed over the active and passive devices and are designed to connect the various devices to form functional circuitry. In some embodiments, the metallization layers are formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

In some embodiments, the conductive connectors 162 are reflowed to attach the first package component 100 to the bond pads 204. The conductive connectors 162 electrically and/or physically couple the second package component 200, including metallization layers in the substrate 202, to the first package component 100. In some embodiments, a solder resist 206 is formed on the substrate 202. In some embodiments, the conductive connectors 162 are disposed in openings in the solder resist 206 to be electrically and mechanically coupled to the bond pads 204. In some embodiments, the solder resist 206 is used to protect areas of the substrate 202 from external damage.

In some embodiments, the conductive connectors 162 have an epoxy flux (not shown) formed thereon before they are reflowed with at least some of the epoxy portion of the epoxy flux remaining after the first package component 100 is attached to the second package component 200. This remaining epoxy portion may act as an underfill to reduce stress and protect the joints resulting from reflowing the conductive connectors 162. In some embodiments, an underfill 208 is formed between the first package component 100 and the second package component 200 and surrounding the conductive connectors 162. In some embodiments, the underfill 208 is formed by a capillary flow process after the second package component 200 is attached or may be formed by a suitable deposition method before the second package component 200 is attached.

In some embodiments, a thermal interface material (TIM) 400 is disposed on the first package component 100 to enhance the thermal-dissipation of the first package component 100. To be more specific, the thermal interface material 400 fully covers the integrated circuit dies 50 to dissipate the heat generated by the integrated circuit dies 50. In some embodiments, the thermal interface material 400 exposes the underfill 150. That is, in some embodiments, one edge of the thermal interface material 400 is aligned with one edge of the integrated circuit dies 50.

Figure 13:
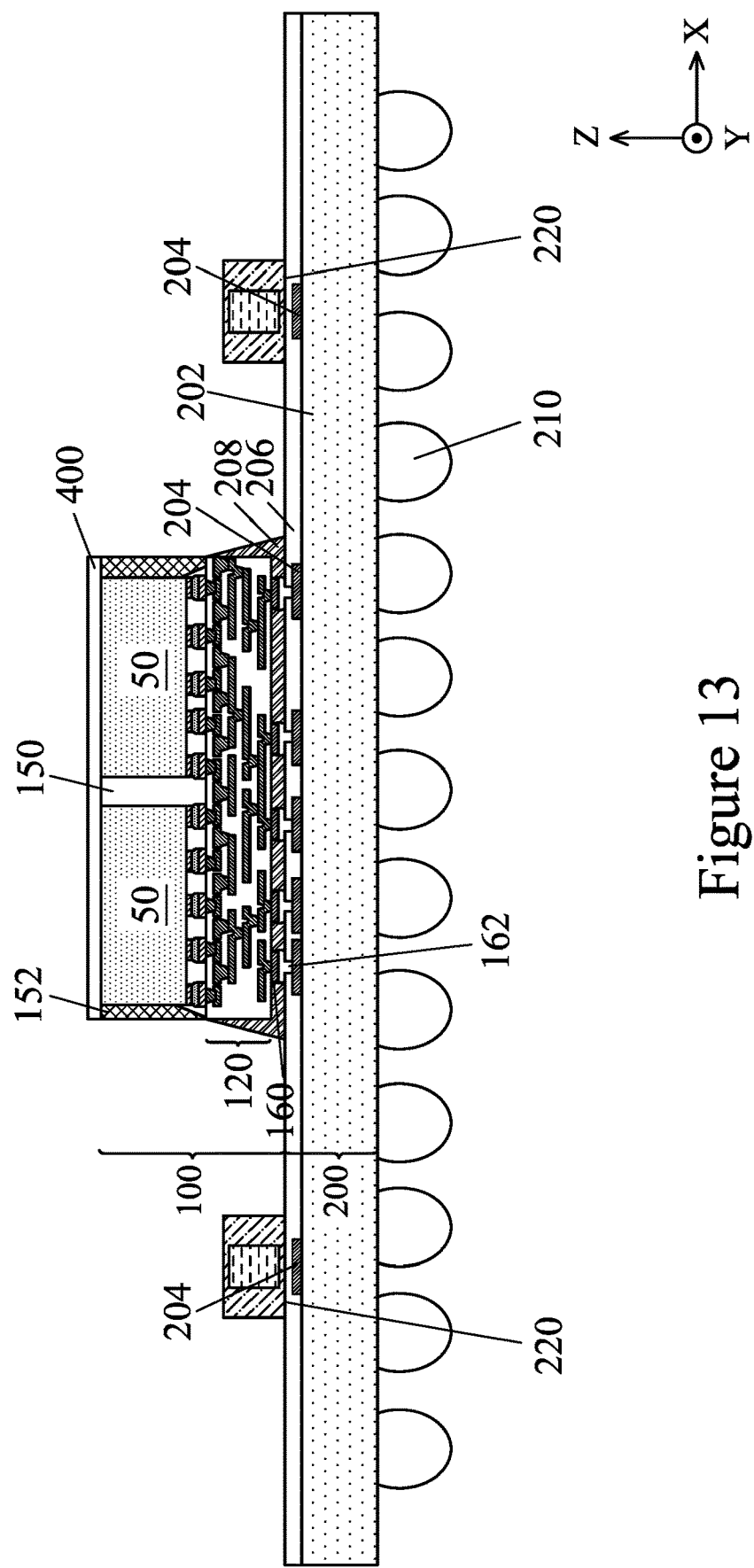

In FIG. 13, the solder resist 206 is formed on the substrate 202. In some embodiments, the solder resist 206 is formed on the entire top surface of the substrate 202, enhancing the protection of the substrate 202 from external damage. The electronic component 220 is electrically and mechanically coupled to the bond pads 204 on the substrate 202. In some embodiments, a thermal interface material (TIM) 400 is disposed on the first package component 100 to enhance the thermal-dissipation of the first package component 100. To be more specific, the thermal interface material 400 may cover the whole top surface of the first package component 100 and may fully cover the integrated circuit dies 50 and the underfill 150. Accordingly, it would be easier to arrange the thermal interface material 400 on the first package component 100. In some embodiments, the shape and position of the thermal interface material 400 may be adjusted. The edges of the thermal interface material 400 may not be aligned with edges of the integrated circuit dies 50 or edges of the first package component 100.

Figure 14:
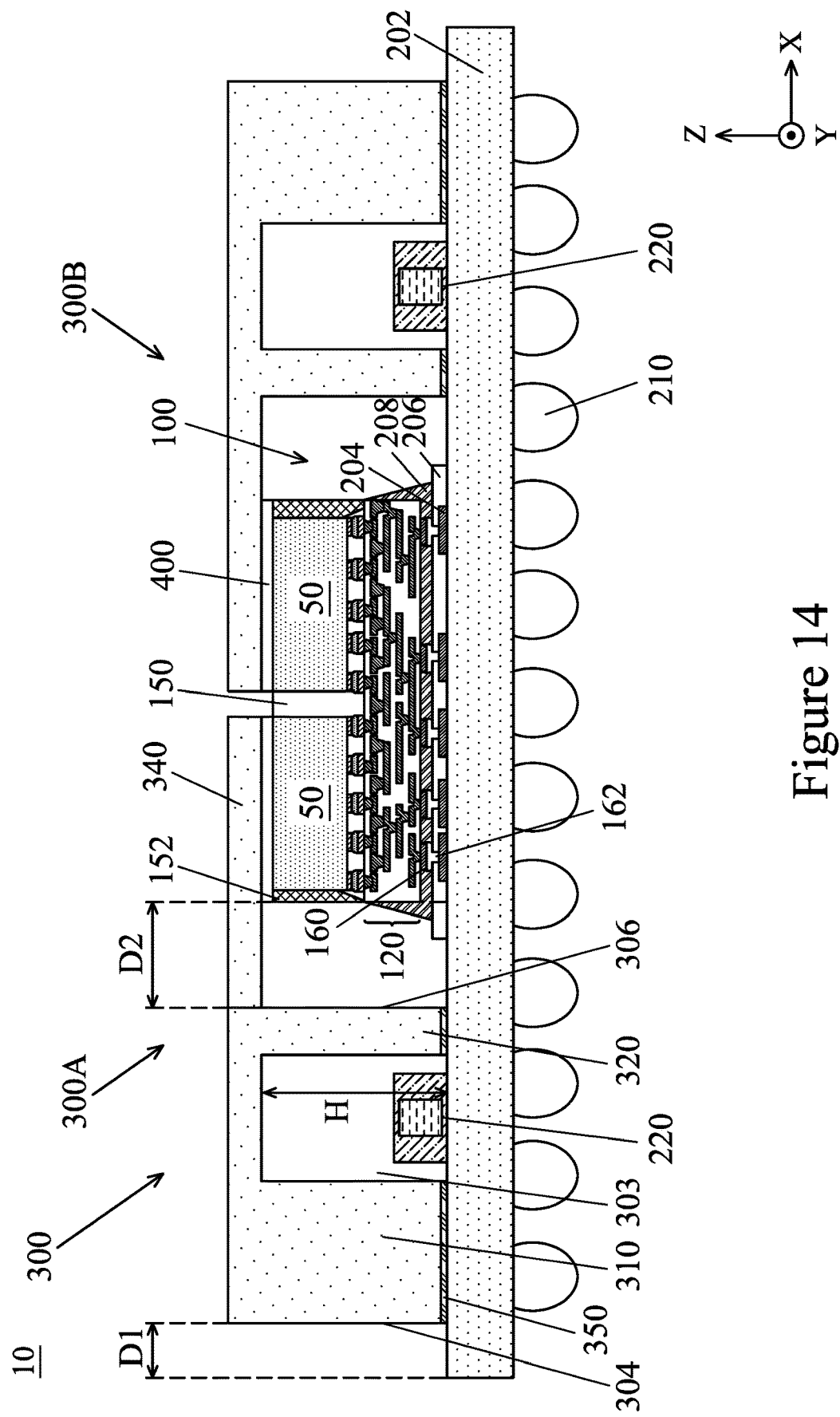
FIG. 14 illustrates a cross-sectional view of a package structure in accordance with some embodiments.

In FIG. 14, a lid structure 300 is mounted on the second package component 200 to form a package structure 10. It should be noted that FIG. 14 is illustrated along the line A-A' in FIG. 15, for example. In some embodiments, the lid structure 300 includes a first section 300A and a second section 300B that are disposed around the first package component 100 for containing the first package component 100. The lid structure 300 (i.e. the first section 300A and the second section 300B) covers the integrated circuit dies 50, and exposes the underfill 150. Accordingly, the first section 300A and the second section 300B of the lid structure 300 are separated from each other. That is, a gap is formed between the first section 300A and the second section 300B. In some embodiments, the length of the gap between the first section 300A and the second section 300B is in a range from about 10 μm to about 1000 μm.

It should be noted that the coefficients of thermal expansion (CTE) among the substrate 202, the first package component 100, and the lid structure 300 are mismatched, underfill delamination or trace broken issue would occur and negatively affect the reliability of the package structure 10. In the present embodiment, the lid structure 300 exposes the underfill 150, and the underfill delamination or trace broken issue may be reduced, enhancing the reliability of the package structure 10.

In addition, the first section 300A and the second section 300B of the lid structure 300 each include a first foot 310, a second foot 320, and a body 340. In some embodiments, the first foot 310 and the second foot 320 are located on one side of the first package component 100 and extend toward the substrate 202. The body 340 is connected to the first foot 310 and the second foot 320, and extends directly above the first package component 100. A recess 303 is formed by the first foot 310, the second foot 320, and the body 340 for containing the electronic component 220. In some embodiments, a height H of the recess 303 is greater than a height of the electronic component 220. Accordingly, the electronic component 220 can be contained in the recess 303 successfully. Similarly, a width of the recess 303 is greater than a width of the electronic component 220, and/or a length of the recess 303 is greater than a length of the electronic component 220.

Accordingly, the electronic component 220 is covered and protected by the lid structure 300, reducing the possibility that the electronic component 220 is damaged. In some embodiments, the electronic component 220 is separated from the first foot 310, the second foot 320, and/or the body 340. As such, a buffer region is provided between the electronic component 220 and the lid structure 300, and the assembly of the package structure 10 is easier, and the possibility that the electronic component 220 is damaged by the lid structure 300 is also reduced.

In some embodiments, the lid structure 300 is attached to the substrate 202 via an adhesive material 350. For example, the adhesive material 350 is disposed on the first foot 310 and the second foot 320. Since the lid structure 300 includes multiple contacts (such as the first foot 310 and the second foot 320) with the substrate 202, it helps to reduce the warpage of the package structure 10.

In some embodiments, a distance D1 between the outer edge 304 of the lid structure 300 and the edge of the substrate 202 in the X direction is ranged from 0 to about 10 mm. That is to say, in some embodiments, the outer edge 304 is aligned with the edge of the substrate 202. In some embodiments, a distance D2 between the inner edge 306 of the lid structure 300 and the edge of the first package component 100 (for example, the edge of the encapsulant 152) in the direction X is ranged from 0 to about 10 mm. In some embodiments, the distances D1 and D2 may be the same or different from other, and may be adjusted by those skilled in the art to reduce the warpage of the package structure 10.

Figure 15:
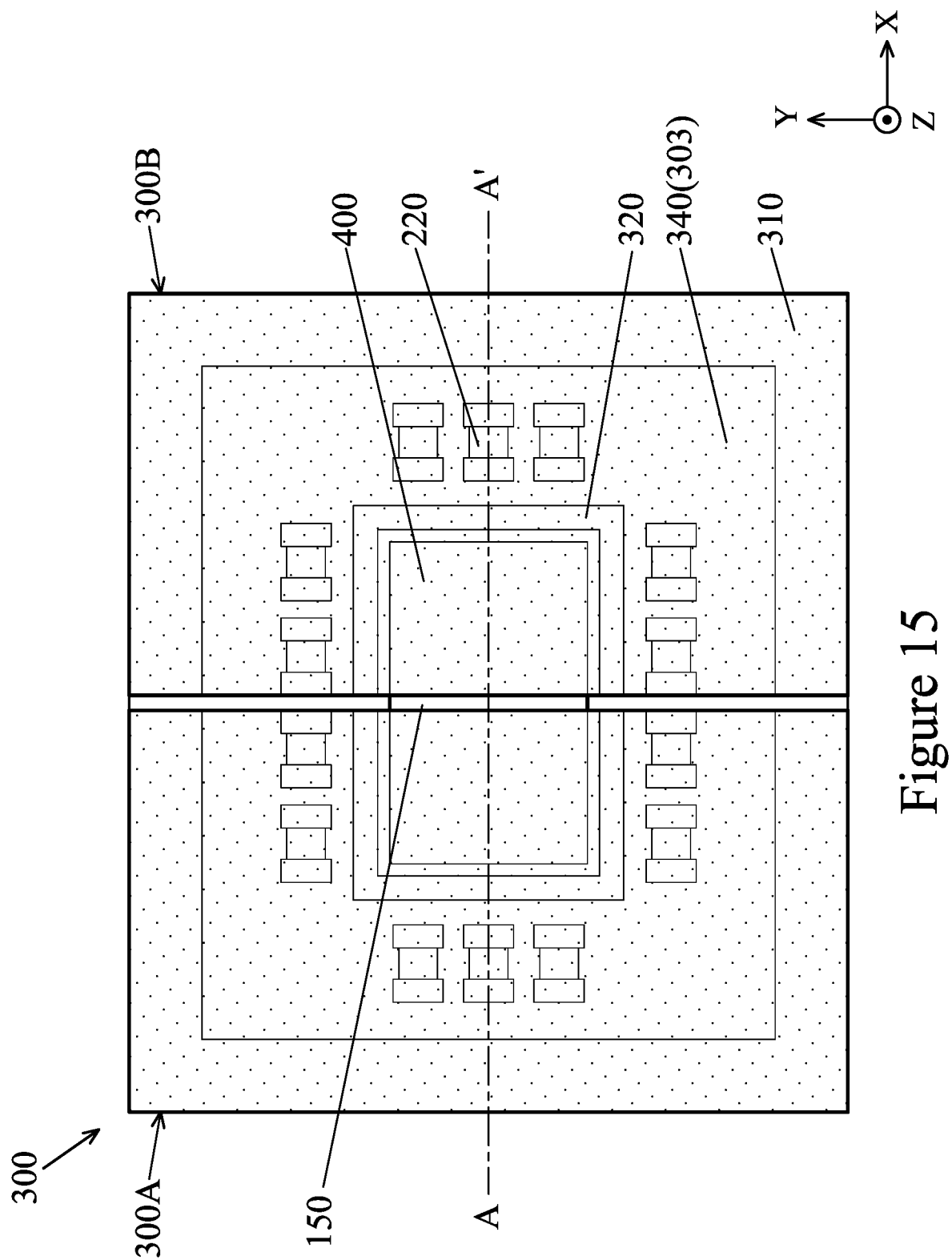
FIG. 15 illustrates a top view of the package structure in accordance with some embodiments.

In FIG. 15, a top view of the package structure 10 is illustrated. It should be noted that the internal structure under the lid structure 300 is also shown in the present embodiment. In some embodiments, the recess 303 is formed on all sides of the lid structure 300, and a plurality of electronic components 220 are disposed in the recess 303. In some embodiments, the lid structure 300 does not overlap the underfill 150 in the top view. In some embodiments, the area of the first section 300A of the lid structure 300 is substantially the same as the area of the second section 300B of the lid structure 300. However, the area or position of the sections of the lid structure 300 may be determined and adjusted by those skilled in the art.

Figure 16:
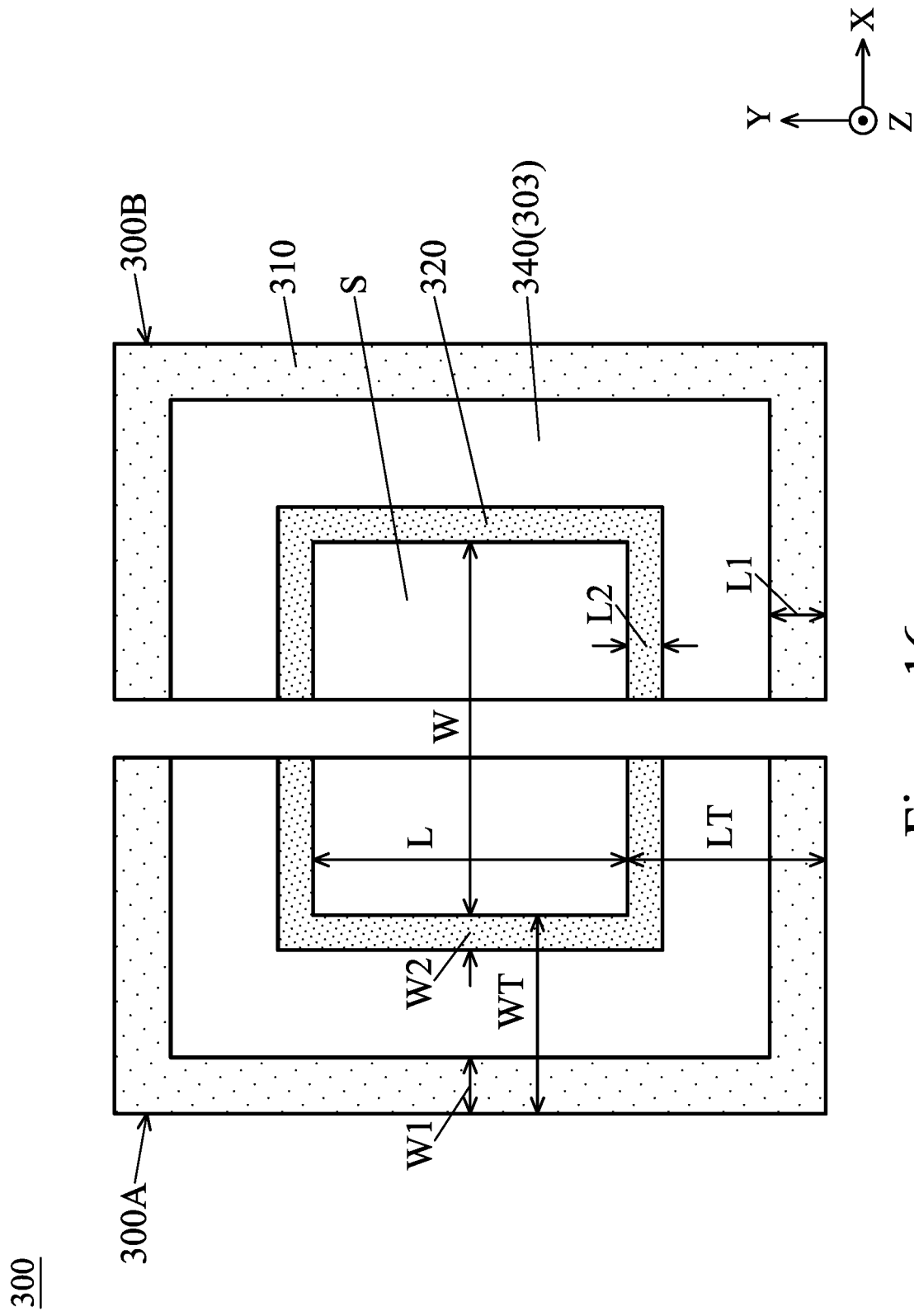
FIGS. 16 through 19 illustrate bottom views of a lid structure of the package structure in accordance with some embodiments.

In FIG. 16, the first section 300A of the lid structure 300 has a width WT, the first foot 310 has a width W1, and the second foot 320 has a width W2. The widths WT, W1 and W2 are measured in the direction X, for example. In some embodiments, the width WT is greater than the sum of the widths W1 and W2. In some embodiments, the widths W1 and W2 are equal. In some embodiments, the widths W1 and W2 are different, and the width W1 is greater than the width W2, for example. Similarly, the first section 300A has a length LT, the first foot 310 has a length L1, and the second foot 320 has a length L2. The lengths LT, L1 and L2 are measured in the direction Y, for example. In some embodiments, the length LT is greater than the sum of the lengths L1 and L2. In some embodiments, the lengths L1 and L2 are equal. In some embodiments, the lengths L1 and L2 are different, and the length L1 is greater than the length L2, for example. In some embodiments, the width WT is equal to the length LT, the width W1 is equal to the length L1, and width W2 is equal to the length L2. However, in some embodiments, the above widths WT, W1, and W2 do not each correspond to the lengths LT, L1, and L2. The configuration of the second section 300B may be similar to the above configuration of the first section 300A, and will not be repeated below.

A space S formed between the second feet 320 of the first section 300A and the second section 300B has a width W and a length L that corresponds to the first package component 100. As such, the first package component 100 is suitably contained in the space S. In addition, it should be noted that the above widths WT, W1, and W2 and the lengths LT, L1, and L2 can be determined to minimize the warpage of the package structure 10.

Figure 17:
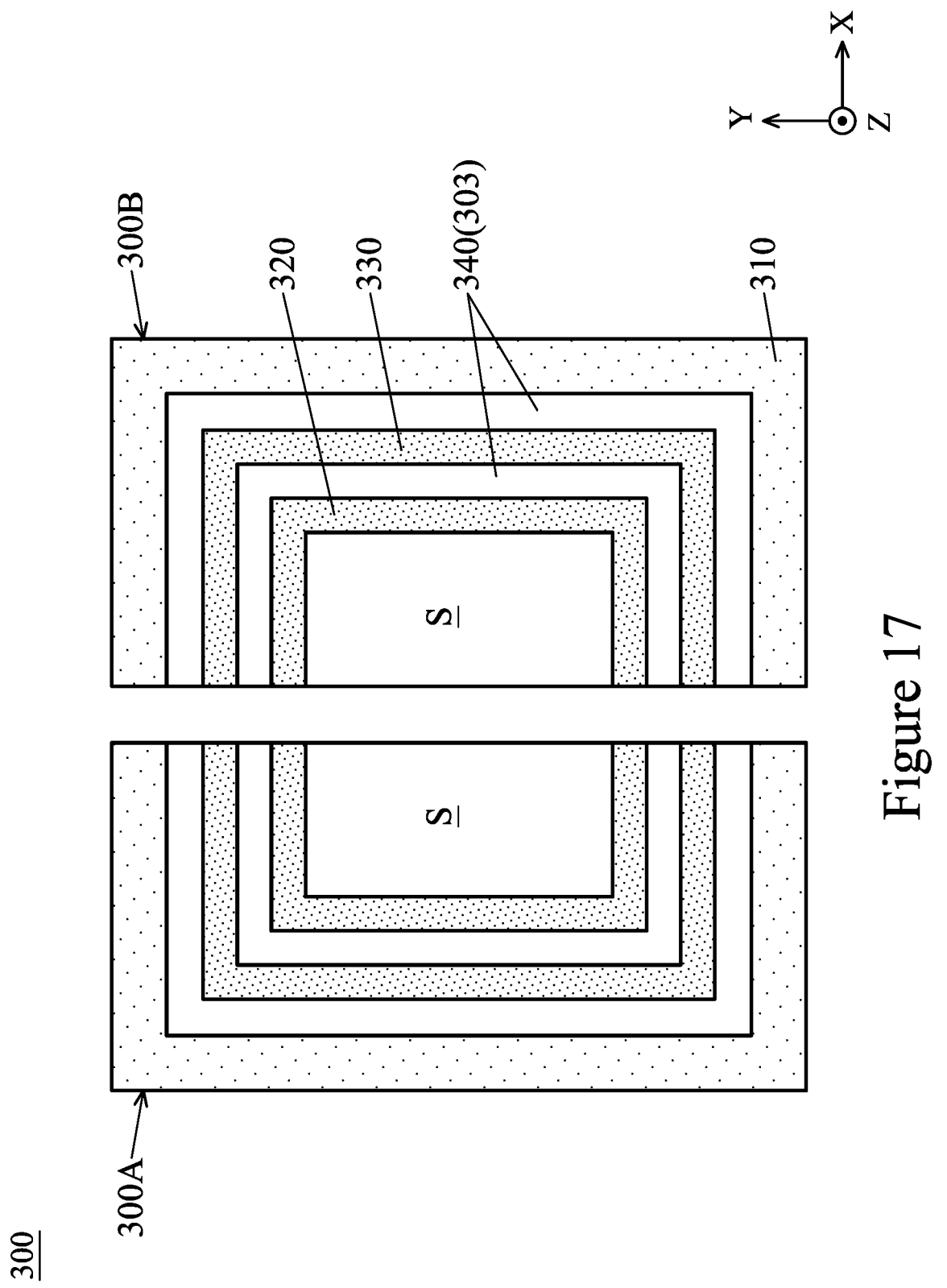

In FIG. 17, the lid structure 300 further has a third foot 330 located between the first foot 310 and the second foot 320. In some embodiments, the third foot 330 is connected to the body 340 and configured to support the body 340. The arrangement of the third foot 330 facilitates reducing the warpage of the package structure 10. In some embodiments, the width of the lid structure 300 is greater than the sum of the widths of the first foot 310, the second foot 320, and the third foot 330. The lid structure 300 further has two recesses 303, wherein one of the recesses 303 is formed between the first foot 310 and the second foot 320, and the other of the recesses 303 is formed between the second foot 320 and the third foot 330. In some embodiments, the electronic component 220 (not shown in the present embodiment) may be located in the recess 303 between the first foot 310 and the second foot 320. In some embodiments, the electronic component 220 may be located in the recess 303 between the second foot 320 and the third foot 330. In some embodiments, multiple electronic components 220 may be located in the both recesses 303. In some embodiments, no electronic component 220 is located in any of the recesses 303.

Figure 18:
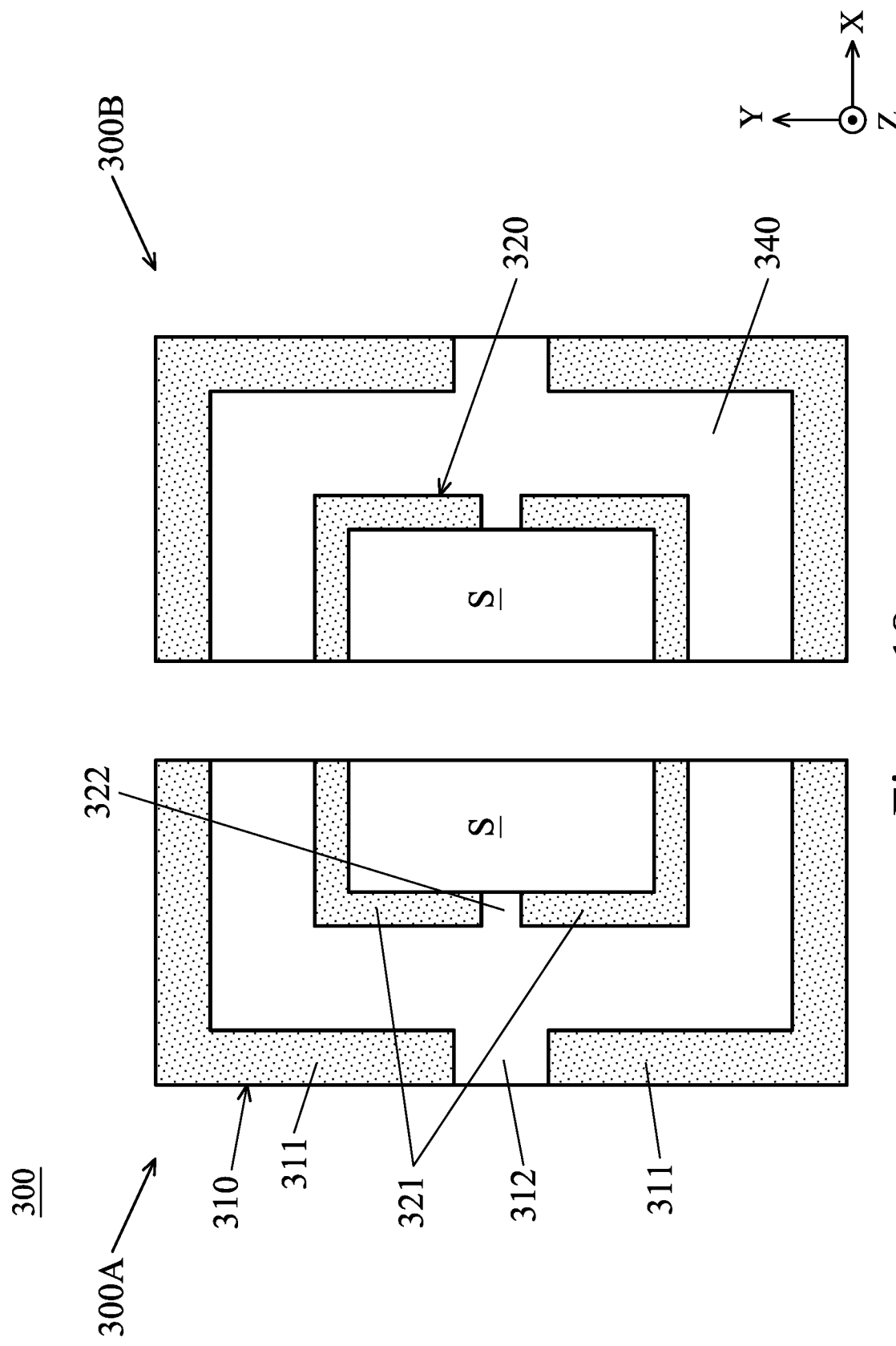

In FIG. 18, the first foot 310 includes a plurality of first segments 311, and an opening 312 is formed between the first segments 311. In some embodiments, the heights of the openings 312 and 322 are less than or substantially the same as the height of the recess 303. The second foot 320 includes a plurality of second segments 321, and an opening 322 is formed between the second segments 321. In some embodiments, the openings 312 and 322 are located on and face the substrate 202. The top surface of the substrate 202 is exposed from the openings 312 and 322. In some embodiments, the opening 312 is substantially aligned with the opening 322. In some embodiments, the opening 312 overlaps with the opening 322 in the direction X or the direction Y. In the present embodiment, one opening 312 and one opening 322 are located on each side of the lid structure 300. The arrangement of the openings 312 and 322 helps to reduce the warpage of the package structure 10. In some embodiments, the sizes of the openings 312 and 322 are different from each other, and the sizes of the openings 312 and 322 may be referred to as the width or length in the direction X or the direction Y. For example, as shown in FIG. 18, the size of the opening 312 is greater than the size of the opening 322 in the direction Y. By controlling the sizes of the openings 312 and 322, the footprints of the first foot 310 and the second foot 320 may be adjusted to optimize the reduction of the warpage of the package structure 10.

Figure 19:
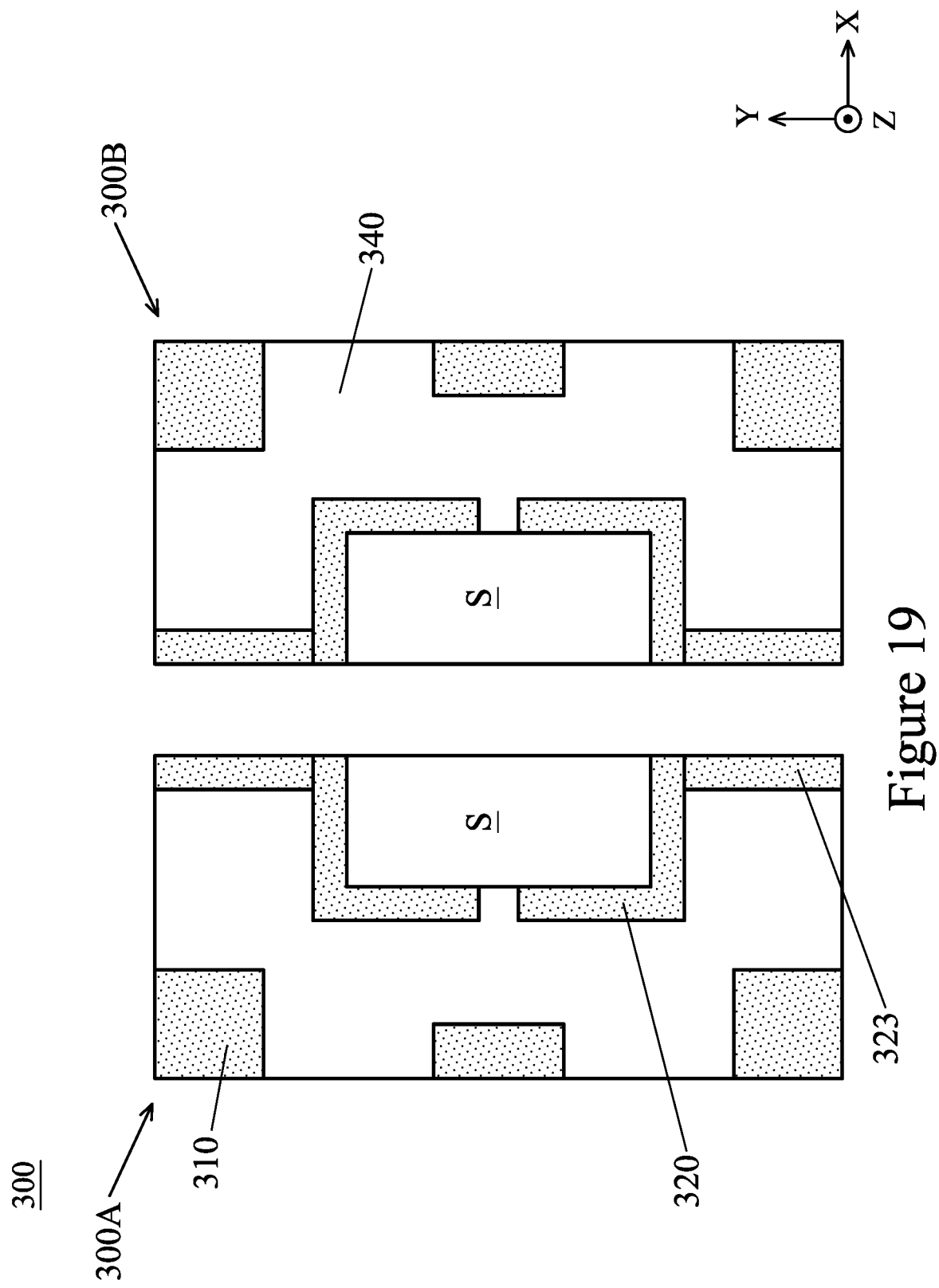

In FIG. 19, the first foot 310 includes a plurality of segments located at corners of the lid structure 300, and the second foot 320 includes a plurality of segments located in the middle of the lid structure 300. Accordingly, the second foot 320 is closer to first package component 100 (i.e. the space S) than the first foot 310. In some embodiments, the second foot 320 further has an extending portion 323 disposed along the edge of the lid structure 300 (i.e. the first section 300A and/or the second section 300B). Similarly, the arrangement of the extending portion 323 also helps to reduce the warpage of the package structure 10. It should be noted that various embodiments of the lid structure 300 are discussed above, and these embodiments may be adjusted and/or combined based on the above description.

Figure 20:
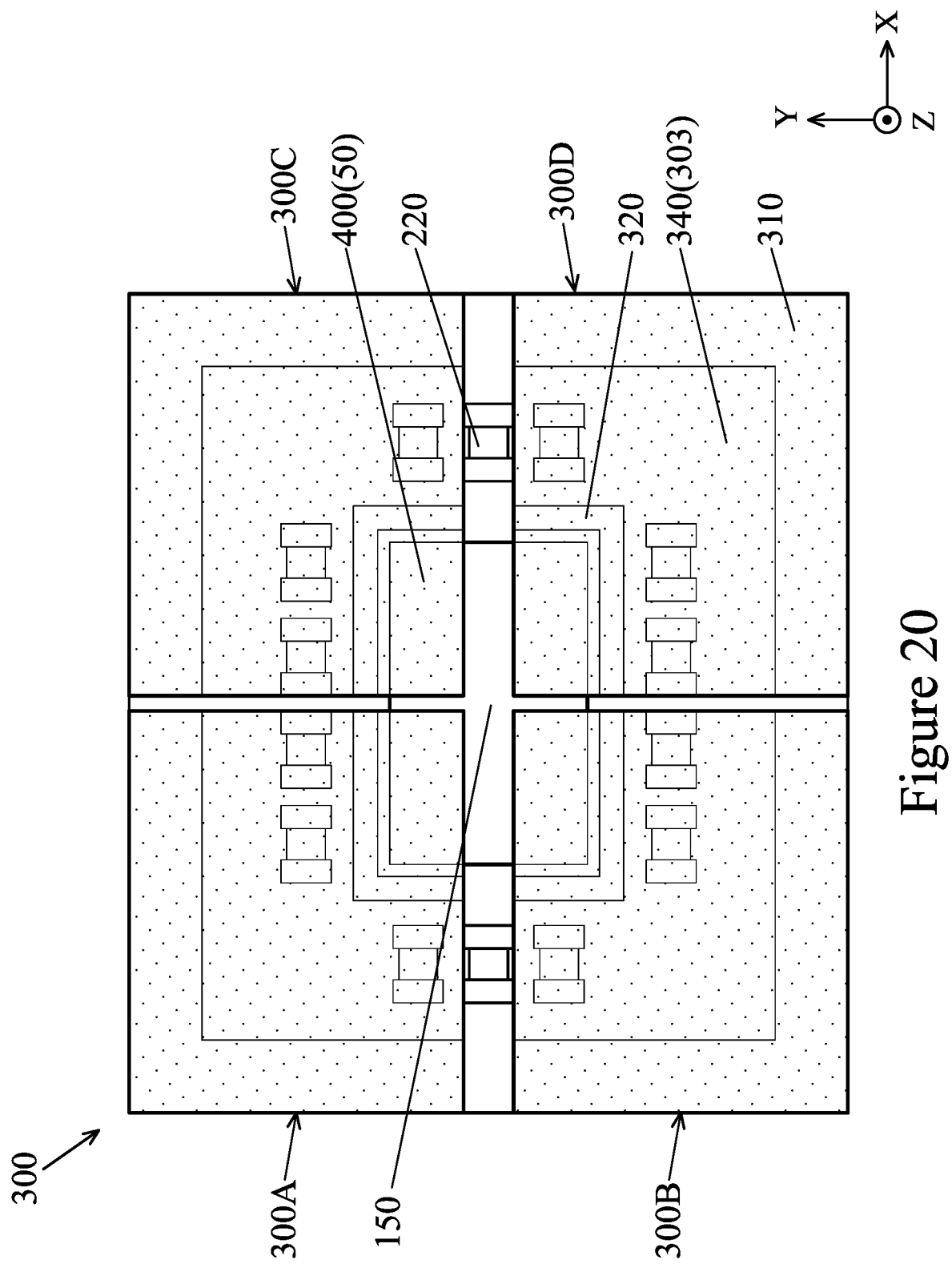
FIGS. 20 through 21 illustrate top views of the package structure in accordance with some embodiments.

In FIG. 20, a top view of the package structure 10 is illustrated. It should be noted that the structures and/or elements in the present embodiment are similar to structures and/or elements shown in FIG. 15, and therefore these structures and/or elements will be labeled with similar numerals and will not be discussed in detail again. In some embodiments, the lid structure 300 includes a first section 300A, a second section 300B, a third section 300C, and a fourth section 300D that are disposed around the first package component 100 for containing the first package component 100. Each of the sections 300A, 300B, 300C, and 300D of the lid structure 300 cover one of the integrated circuit dies 50 (which are covered by the thermal interface material 400), and expose the underfill 150 between the integrated circuit dies 50. Accordingly, these sections 300A, 300B, 300C, and 300D of the lid structure 300 are separated from each other. That is, a gap is formed among these sections 300A, 300B, 300C, and 300D. In some embodiments, the areas of these sections 300A, 300B, 300C, and 300D are substantially the same.

Figure 21:
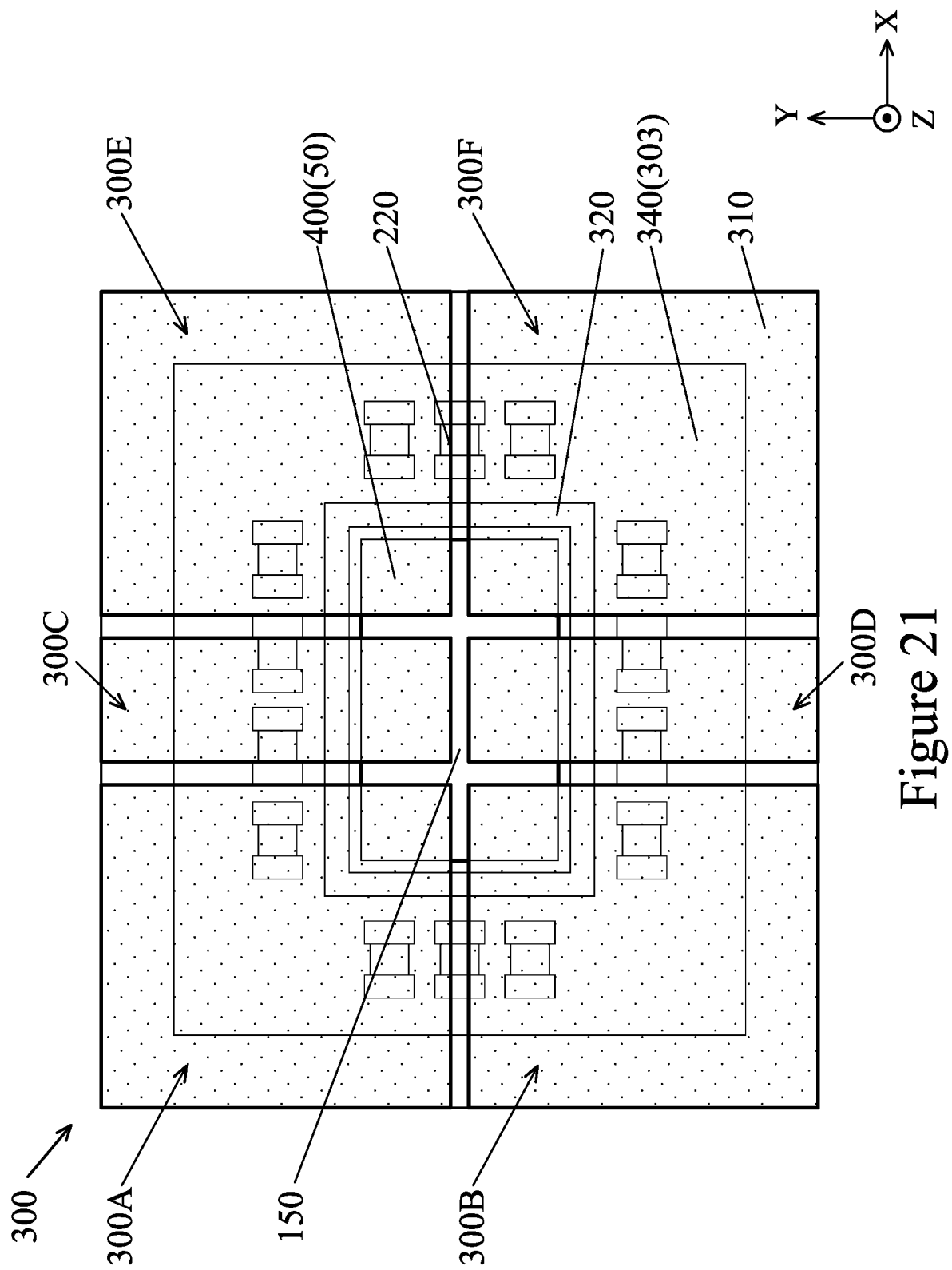

In FIG. 21, a top view of the package structure 10 is illustrated. It should be noted that the structures and/or elements in the present embodiment are similar to structures and/or elements shown in FIG. 20, and therefore these structures and/or elements will be labeled with similar numerals and will not be discussed in detail again. In some embodiments, the lid structure 300 includes a first section 300A, a second section 300B, a third section 300C, a fourth section 300D, a fifth section 300E, and a sixth section 300F that are disposed around the first package component 100 for containing the first package component 100. Each of the sections 300A, 300B, 300C, 300D, 300E and 300F of the lid structure 300 cover one of the integrated circuit dies 50, and expose the underfill 150 between the integrated circuit dies 50. Accordingly, these sections 300A, 300B, 300C, 300D, 300E and 300F of the lid structure 300 are separated from each other. That is, a gap is formed among these sections 300A, 300B, 300C, 300D, 300E and 300F. In some embodiments, the areas of these sections 300A, 300B, 300C, 300D, 300E and 300F can be different. For example, the area of the first section 300A is greater than the area of the third section 300C. However, it should be appreciated that the area or position of the sections of the lid structure 300 may be determined and adjusted by those skilled in the art.

In some embodiments, some of the electronic components 220 may be exposed from the gap between the sections of the lid structure 300, for example, shown in FIGS. 20 and 21. Accordingly, a protection layer (not shown) may be disposed on the exposed electronic components 220 to protect from foreign objects. In some embodiments, the lid structure 300 (including multiple sections) is positioned on a mounting plate to be aligned with the substrate 202. Therefore, the lid structure 300 can be disposed at the correct position. In this way, the lid structure 300 may be less likely to cover the underfill 150, which helps to reduce the possibility of underfill delamination or crack.

Embodiments of a package structure are provided. The package structure includes a lid structure disposed on the substrate. The lid structure covers the integrated circuit dies and exposes the underfill between the integrated circuit dies. Accordingly, the issue that the CTEs are mismatched among different elements is solved. For example, the lid structure includes a plurality of separate sections to achieve the above function. In some embodiments, the lid structure is a one-piece structure having an opening that exposes the underfill, and therefore it is easier to arrange the lid structure over the first package component. In addition, the lid structure is also configured to protect the electronic component and/or reduce the warpage of the package structure.

In some embodiments, a package structure is provided. The package structure includes a first package component, a second package component, and a lid structure. The first package component includes a plurality of integrated circuit dies and an underfill formed between the integrated circuit dies. The second package component includes a substrate, and the first package component is mounted on the substrate. The lid structure is disposed on the second package component and around the first package component, and the lid structure covers the integrated circuit dies and exposes the underfill.

In some embodiments, a package structure is provided. The package structure includes a first package component and a second package component. The second package component includes a substrate, and the first package component is mounted on the substrate. The package structure also includes a lid structure disposed on the second package component and around the first package component. The lid structure has a plurality of sections separated from each other, and each of the sections of the lid structure partially covers the first package component.

In some embodiments, a method for forming a package structure is provided. The method includes providing a substrate and mounting the first package component to the substrate. The first package component comprises a plurality of integrated circuit dies and an underfill formed between the integrated circuit dies. The method also includes disposing a lid structure on the substrate and around the first package component. The lid structure covers the integrated circuit dies and exposes the underfill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first package component, comprising a plurality of integrated circuit dies and an underfill formed between the integrated circuit dies;
   a second package component comprising a substrate, wherein the first package component is mounted on the substrate;
   a lid structure disposed on the second package component and around the first package component, wherein the lid structure has a plurality of sections separated from each other by first spaces, and each of the sections of the lid structure covers the integrated circuit dies and exposes the underfill, wherein the underfill is separated from the first spaces; and
   a thermal interface material comprising a first portion and a second portion vertically sandwiched between the plurality of integrated circuit dies of the first package component and the lid structure, wherein the first portion and the second portion of the thermal interface material are laterally separated from each other, and a space between the first portion and the second portion is exposed from the lid structure.

2. The package structure as claimed in claim 1, further comprising an electronic component disposed on the substrate, wherein the lid structure has a first foot and a second foot, the first foot and the second foot extend toward the substrate, the electronic component is covered by the lid structure and located between the first foot and the second foot.

3. The package structure as claimed in claim 2, wherein the lid structure further has a body connected to the first foot and the second foot, and a gap is formed between the electronic component and the body.

4. The package structure as claimed in claim 2, wherein the lid structure further has a third foot disposed between the first foot and the second foot.

5. The package structure as claimed in claim 2, wherein the second foot is located closer to the first package component than the first foot, and the second foot extends to an edge of the lid structure.

6. The package structure as claimed in claim 1, wherein sidewalls of the first portion and the second portion of the thermal interface material are free from contact with the lid structure.

7. A package structure, comprising:
   a first package component mounted on a substrate;
   a lid structure disposed on the first package component and around the first package component, wherein the lid structure has a plurality of sections separated from each other, and each of the sections of the lid structure partially covers the first package component and exposes a top surface of an underfill of the first package component, wherein the sections of the lid structure are free from direct contact with the underfill; and
   a thermal interface material located between the first package component and the lid structure, wherein the thermal interface material has a plurality of sections, and the plurality of sections are separated from each other without overlapping a top surface of the underfill.

8. The package structure as claimed in claim 7, wherein in a top view, areas of the sections of the lid structure are substantially the same.

9. The package structure as claimed in claim 7, wherein in a top view, an area of one section of the lid structure is different from an area of another section of the lid structure.

10. The package structure as claimed in claim 7, wherein the lid structure has a first foot and a second foot, the first foot and the second foot extend toward the substrate, the second foot is located closer to the first package component than the first foot, and the second foot extends to an edge of the lid structure.

11. The package structure as claimed in claim 10, wherein the first foot and the second foot are separated from the thermal interface material in a top view.

12. The package structure as claimed in claim 7, further comprising an electronic component disposed on the substrate, and the electronic component is located in a recess of the lid structure.

13. The package structure as claimed in claim 12, wherein a height of the recess is greater than a height of the electronic component.

14. The package structure as claimed in claim 7, wherein an edge of the lid structure is aligned with an edge of the thermal interface material.

15. The package structure as claimed in claim 7, wherein areas of the plurality of sections of the thermal interface material are different from each other.

16. A method for forming a package structure, comprising:
providing a substrate;
mounting a first package component to the substrate, wherein the first package component comprises a plurality of integrated circuit dies and an underfill formed between the integrated circuit dies;
disposing a thermal interface material on the first package component, wherein the thermal interface material covers the integrated circuit dies and has an opening exposing the underfill in a normal direction of the substrate; and
disposing a lid structure on the substrate and around the first package component, wherein the lid structure covers the integrated circuit dies and exposes the underfill in the normal direction of the substrate, a top surface of the underfill is lower than a top surface of the lid structure, and a bottom surface of the underfill is higher than a bottom surface of the lid structure.

17. The method as claimed in claim 16, further comprising disposing an electronic component on the substrate, wherein disposing the lid structure further comprises forming a recess on the lid structure, and the electronic component is contained in the recess.

18. The method as claimed in claim 17, wherein a height of the recess is greater than a height of the electronic component.

19. The method as claimed in claim 16, wherein the lid structure comprises a plurality of sections separated from each other, and each of the sections of the lid structure covers one of the integrated circuit dies and exposes the underfill.

20. The method as claimed in claim 16, wherein on a plane perpendicular to the normal direction of the substrate, a surface area of the thermal interface material is greater than a surface area of the integrated circuit dies.

* * * * *